United States Patent
Lee et al.

(10) Patent No.: US 7,968,447 B2
(45) Date of Patent: Jun. 28, 2011

(54) SEMICONDUCTOR DEVICE AND METHODS OF MANUFACTURING THE SAME

(75) Inventors: Young-Ho Lee, Seoul (KR); Jae-Hwang Sim, Seoul (KR); Jae-Kwan Park, Suwon-si (KR); Mo-Seok Kim, Gwangmyeong-si (KR); Jong-Min Lee, Ulsan (KR); Dong-Sik Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 12/465,013

(22) Filed: May 13, 2009

(65) Prior Publication Data

US 2009/0305495 A1 Dec. 10, 2009

(30) Foreign Application Priority Data

Jun. 4, 2008 (KR) .................. 10-2008-0052740

(51) Int. Cl.
*H01L 21/4763* (2006.01)

(52) U.S. Cl. ........ 438/618; 438/633; 438/631; 438/256; 438/253; 438/279; 257/E21.585; 257/E21.648; 257/306; 257/E27.088

(58) Field of Classification Search .................. 438/618, 438/633, 631, 256, 253, 279; 257/774, E21.585, 257/306, E27.088, E21.648
See application file for complete search history.

(56) References Cited

U.S. PATENT DOCUMENTS

| | | | |
|---|---|---|---|
| 7,776,747 B2* | 8/2010 | Ban et al. ...................... | 438/690 |
| 2007/0049010 A1* | 3/2007 | Burgess et al. ............... | 438/633 |
| 2008/0054483 A1* | 3/2008 | Lee et al. ...................... | 257/774 |
| 2008/0203456 A1* | 8/2008 | Kim .............................. | 257/306 |

FOREIGN PATENT DOCUMENTS

| | | |
|---|---|---|
| JP | 2003-60028 | 2/2003 |
| KR | 2000-045452 | 7/2000 |
| KR | 10-2005-0110785 | 11/2005 |

* cited by examiner

*Primary Examiner* — Jarrett J Stark
*Assistant Examiner* — Wilner Jean Baptiste
(74) *Attorney, Agent, or Firm* — Mills & Onello, LLP

(57) ABSTRACT

A semiconductor device may include plugs disposed in a zigzag pattern, interconnections electrically connected to the plugs and a protection pattern which is interposed between the plugs and the interconnections to selectively expose the plugs. The interconnections may include a connection portion which is in contact with plugs selectively exposed by the protection pattern. A method of manufacturing a semiconductor device includes, after forming a molding pattern and a mask pattern, selectively etching a protection layer using the mask pattern to form a protection pattern exposing a plug.

14 Claims, 30 Drawing Sheets

SEMICONDUCTOR DEVICE AND METHODS OF MANUFACTURING THE SAME

CROSS-REFERENCE TO RELATED APPLICATIONS

This U.S. non-provisional patent application claims priority under 35 U.S.C. §119 of Korean Patent Application No. 10-2008-0052740, filed in the Korean Intellectual Property Office on Jun. 4, 2008, the entire contents of which are herein incorporated by reference in their entirety.

BACKGROUND

The present invention disclosed herein relates to semiconductor devices that prevent misalignment of interconnections disposed at a small interval and a plug, and methods of manufacturing the same.

Semiconductor devices may be formed to include a plurality of layers such that a plurality of unit devices may be integrated in a semiconductor device. Interconnections may be disposed in a plurality of layers and may be electrically connected to one another. A vertical plug may be formed between layers to electrically connect interconnections. An alignment process is important in order to accurately contact interconnections with the plug connected to the interconnections.

Moreover, as demand for high-integration semiconductor devices increases, space between patterns or interconnections of a semiconductor device is becoming rapidly reduced. As a result, alignment margin is reduced. If misalignment occurs when interconnections formed on different layers are connected to one another, interconnections that must not be connected may be connected. Since the misalignment may cause a malfunction, reliability of a device may be degraded.

SUMMARY

Exemplary embodiments provide a method of manufacturing a semiconductor device. The method may include forming plugs in an interlayer insulating layer on a substrate, forming a protection layer on the interlayer insulating layer and the plugs, forming molding patterns overlapped with edges of the plugs on the protection layer, forming a mask pattern on the protection layer and the molding patterns, the mask pattern exposing the protection layer on the plugs, forming a protection pattern exposing the plugs by removing the exposed protection layer using the mask pattern and the molding patterns as an etching mask, removing the mask pattern and forming interconnections between the molding patterns, the interconnections being electrically connected to the plugs.

In one embodiment, the method further comprises stacking hard mask patterns on the molding patterns. In one embodiment, the protection layer includes a material having an etching selectivity with respect to the mask pattern and the hard mask patterns. In one embodiment, forming the molding patterns and the hard mask patterns comprises: forming a molding layer on the protection layer; forming a polysilicon layer on the molding layer; forming a photoresist pattern on the polysilicon layer; continuously etching the polysilicon layer and the molding layer using the photoresist pattern; and removing the photoresist pattern. In one embodiment, the method further comprises, after removing the mask pattern, removing the polysilicon layer. In one embodiment, forming the molding patterns and the hard mask patterns is performed by a double patterning technique.

In one embodiment, the plugs are formed in a zigzag pattern. In one embodiment, forming the plugs comprises: forming first plug holes and second plug holes which are exposing the substrate by selectively etching the interlayer insulating layer; and filling the first plug holes and the second plug holes with conductive material. The first plug holes and the second plug holes can be disposed along a first direction, and each of the second plug holes can be disposed between adjacent first plug holes and is spaced apart from first plug holes toward a second direction crossing the first direction.

In one embodiment, the mask pattern includes openings having the same width and arrangement as the plugs. In one embodiment, forming the mask pattern comprises: forming a spin-on hard mask layer on the protection layer and the hard mask pattern so as to fill a space between the molding patterns; forming a photoresist layer on the spin-on hard mask layer; selectively exposing the photoresist layer; selectively removing the photoresist layer on the plugs; and removing the spin-on hard mask layer exposed by a removal of the photoresist layer.

In one embodiment, the protection layer includes silicon nitride, the molding patterns include silicon oxide, the hard mask patterns include polysilicon and the mask pattern includes photoresist.

In one embodiment, the method further comprises forming a string selection line which is adjacent to the plugs on the substrate and extends in the first direction, word lines adjacent to the string selection line and a ground selection line adjacent to the word lines.

Exemplary embodiments provide a semiconductor device. The semiconductor device may include an interlayer insulating layer on a substrate; plugs disposed in the interlayer insulating layer in a first direction; interconnections which extend in a second direction perpendicular to the first direction, and include a connection portion which has a width smaller than a width of the first direction of the plugs and is in contact with the plugs, the interconnections having the same width as the connection portion in the first direction; and a protection pattern in which the connection portion penetrates, the protection pattern being interposed between the interlayer insulating layer and the interconnections and extending on the interlayer insulating layer and the plugs.

In one embodiment, the plugs include first plugs and second plugs. The first plugs and the second plugs are disposed in the first direction, and each of the second plugs is disposed between the adjacent first plugs and is spaced apart from the first plugs in the second direction.

In one embodiment, the connection portion has same width as top surfaces of the plugs in the second direction.

In one embodiment, the device further comprises molding patterns between the interconnections.

In one embodiment, the molding patterns which are in contact with side surfaces of the interconnections extend in the second direction and are overlapped with edges of the plugs to be disposed on the protection pattern. In one embodiment, the molding patterns include material having an etching selectivity with respect to the protection layer.

In one embodiment, the protection pattern includes silicon nitride and the molding patterns include silicon oxide.

In one embodiment, the device further comprises a string selection line which is adjacent to the plugs on the substrate and extends in the first direction, word lines adjacent to the string selection line and a ground selection line adjacent to the word lines.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
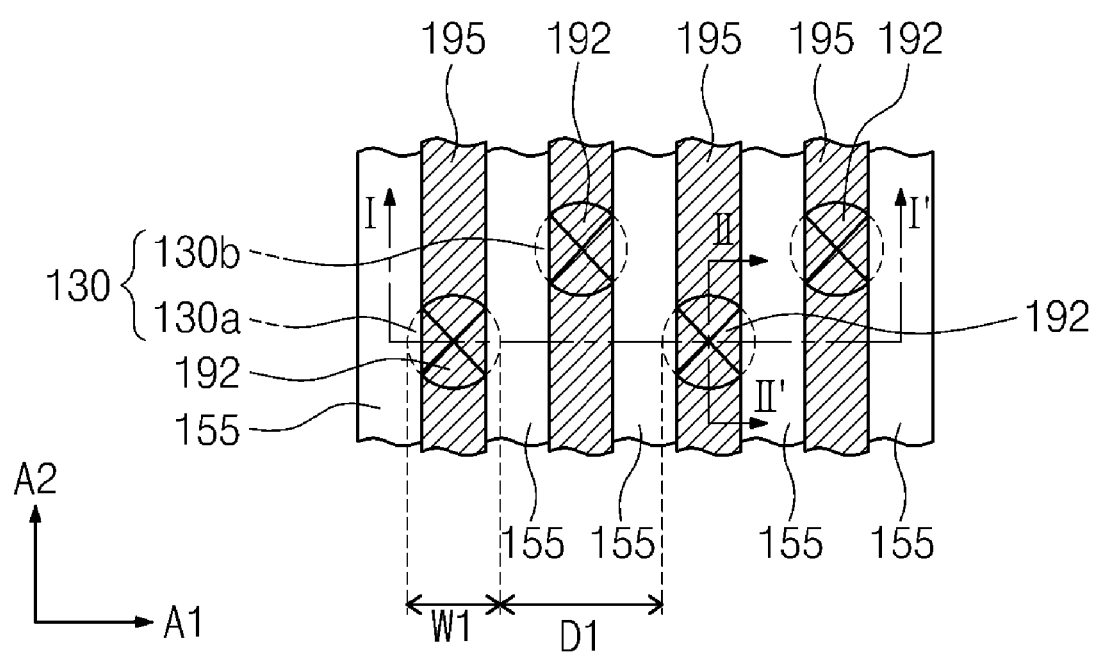
FIG. 1 is a top plan view of a semiconductor device according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the invention to those skilled in the art. In the drawings, the size and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 2:
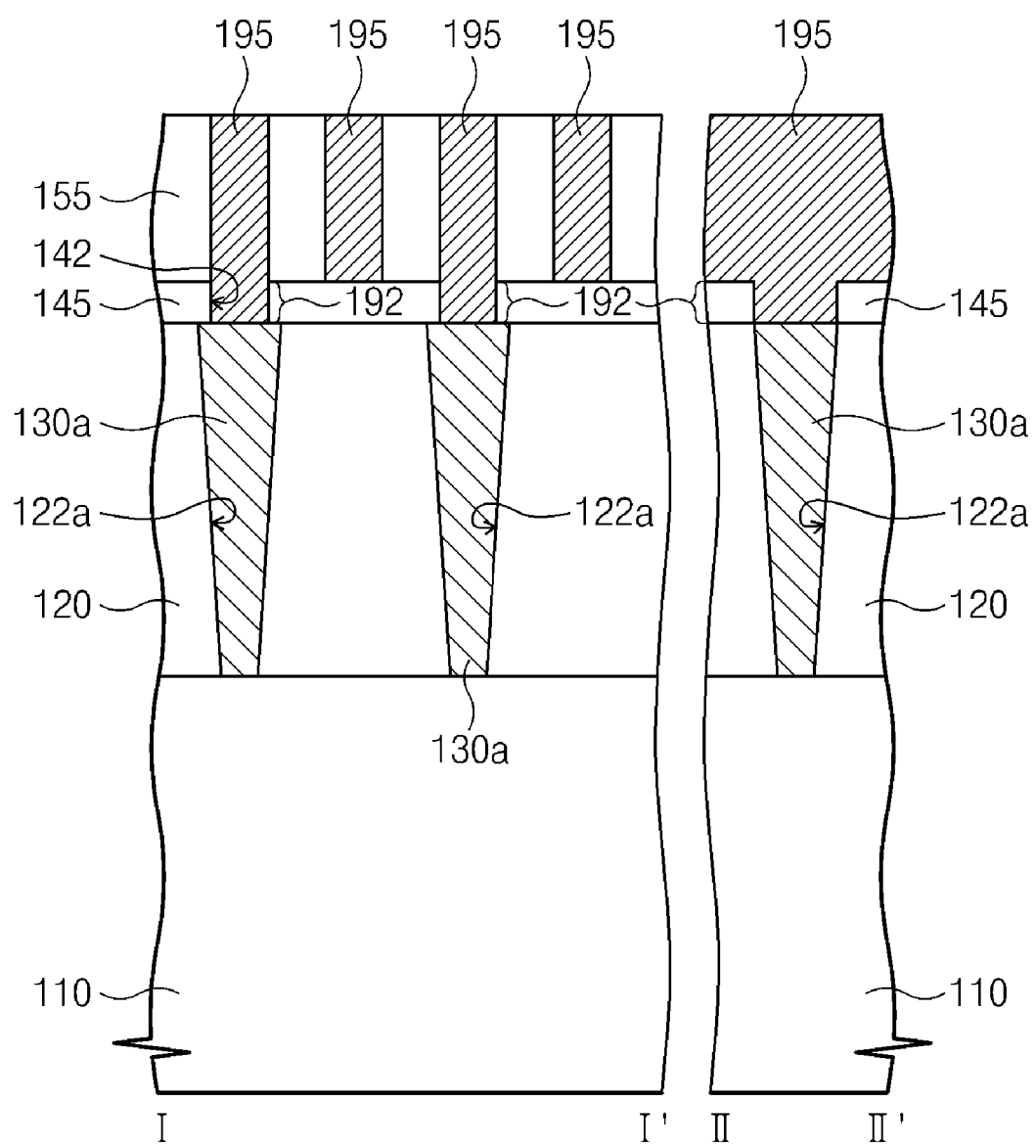
FIG. 2 is a cross sectional view taken along the lines I-I' and II-II' of FIG. 1 illustrating a semiconductor device according to an embodiment of the present invention.

Referring to FIGS. 1 and 2, a semiconductor device according to an embodiment of the present invention will be described.

Plugs 130 in contact with a substrate 110 may be disposed in an interlayer insulating layer 120. The plugs 130 may include first plugs 130a and second plugs 130b. The plugs 130 may be disposed in a staggered or "zigzag" pattern as shown. The plugs 130 may be spaced a first distance (D1) apart from each other to extend in a first direction (A1). The first distance (D1) may be a minimum distance that can be obtained by a photolithography process. Alternatively, the first distance (D1) may be greater than the minimum distance. A first width (W1) of the plugs 130 may be greater than a minimum width that can be obtained by a photolithography process.

Only the first plugs 130a may be adjacent to one another in the first direction (A1). The second plugs 130b may be arranged to be adjacent to one another in the first direction (A1). Each of the second plugs 130b may be disposed between the first plugs 130a adjacent to one another in the first direction (A1), and is spaced apart from the first plugs 130a in a second direction (A2) perpendicular to the first direction (A1). The first plugs 130a and the second plugs 130b may be disposed at a sufficiently wide interval so as not to be overlapped with one another.

A protection pattern 145 including a protection pattern opening 142 may be disposed on the plugs 130 and the interlayer insulating layer 120. A bottom surface of the protection pattern opening 142 may be constituted of a portion of a top surface of the plug 130. The protection pattern opening 142 may have a minimum width or less that can be obtained by a photolithography process in the first direction (A1). The protection pattern opening 142 may have a width the same as a width of the plugs 130 in the second direction (A2). A width of the protection pattern opening 142 may be wider in the second direction (A2) than in the first direction (A1). An edge of a top surface of the plug 130 may be overlapped with the protection pattern 145 in the first direction (A1).

Molding patterns 155 may be disposed on the protection pattern 145 in the second direction (A2). The molding pattern 155 may have a line shape and the protection pattern opening 142 may be disposed between the molding patterns 155. A distance between the molding patterns 155 may be equal to a width of the first direction (A1) of the protection pattern opening 142. A side surface of the molding pattern 155 and a side surface of the protection pattern opening 142 may be aligned with the same side surface. The molding pattern 155 may be overlapped with an edge of a top surface of the plug 130 in the first direction (A1). The molding pattern 155 may be disposed at a minimum interval that can be obtained by a photolithography process. The protection pattern 145 may include a silicon nitride and the molding pattern 155 may include a silicon oxide.

Interconnections 195 may be disposed between the molding patterns 155. The interconnections 195 may include a connection portion 192 filling the protection pattern opening 142. The connection portion 192 may have the same width as the interconnections 195 in the first direction (A1) and may have the same width as the plugs 130 (e.g., a top surface of the plug) in the second direction (A2). The plugs 130 may be electrically connected to the interconnections 195 by the connection portion 192. The interconnections 195 may include a conductive material, in one embodiment a metal material. The metal material has a low resistance and a low ion migration in the interconnections. The metal material may include aluminum, aluminum alloy or copper. A barrier layer (not shown) may be interposed between the interconnections 195 and the molding patterns 155, between the interconnections 195 and the protection pattern 145, and between the interconnections 195 and the plugs 130. The barrier layer can improve a contact characteristic and can prevent a diffusion of metal ions and impurities.

Referring to FIGS. 1 through 12, a method of manufacturing a semiconductor device according to an embodiment of the present invention will be described.

Figure 3:
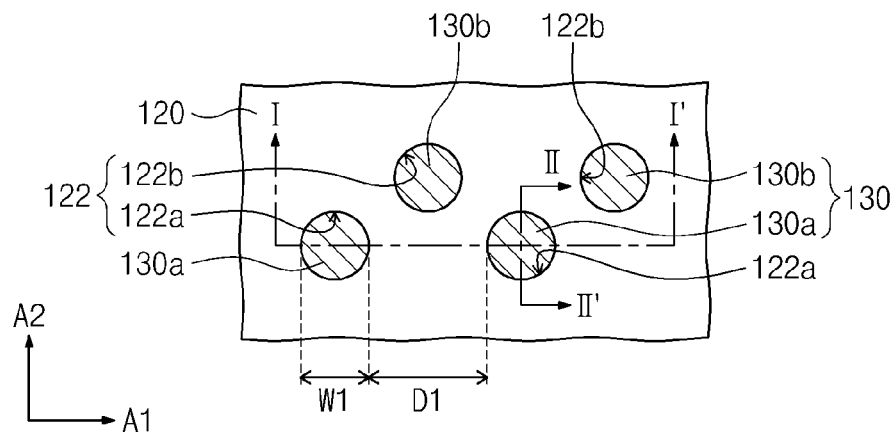
FIGS. 3, 5, 7, 9 and 11 are top plan views illustrating a method of manufacturing a semiconductor device according to an embodiment of the present invention.
Figure 4:
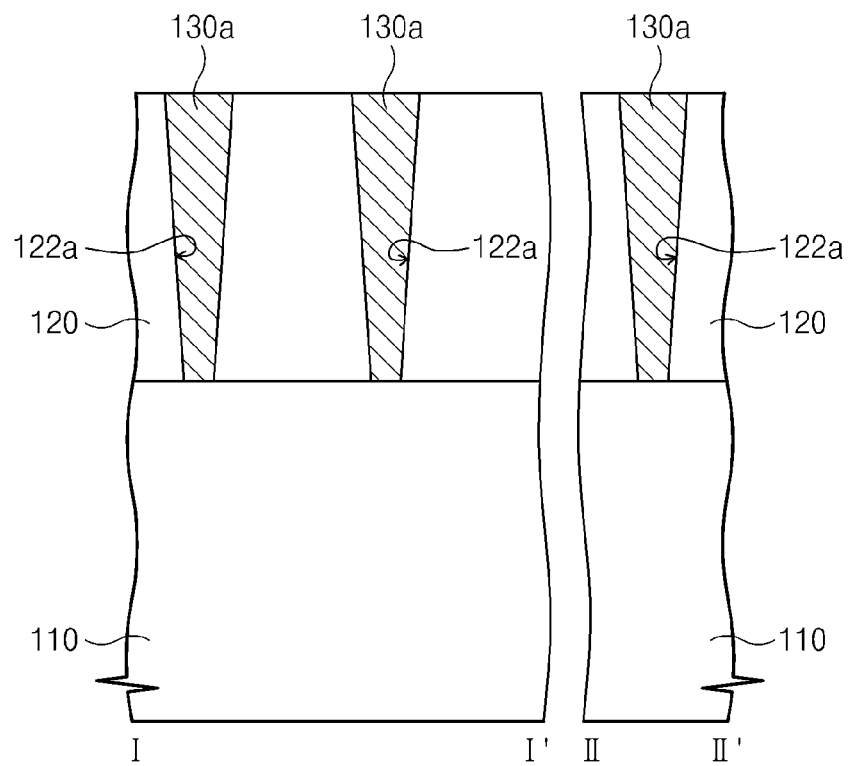
FIGS. 4, 6, 8, 10 and 12 are cross sectional views taken along the lines I-I' and II-II' of FIGS. 3, 5, 7, 9 and 11, respectively, illustrating a method of manufacturing a semiconductor device according to an embodiment of the present invention.

Referring to FIGS. 3 and 4, a substrate 110 may be provided. The substrate 110 is a semiconductor, for example a silicon wafer. The substrate 110 may be a silicon oxide insulator (SOI). An interlayer insulating layer 120 may be formed on the substrate 110. Plug holes 122 exposing a portion of the substrate 110 may be formed in the interlayer insulating layer 120. The plug holes 122 may include first plug holes 122a and second plug holes 122b, and may be formed in the staggered or zigzag configuration. The plug holes 122 may be disposed to be spaced a first distance (D1) apart from one another in a first direction (A1). The first distance (D1) may be a minimum distance that can be obtained by a photolithography process. The first distance (D1) may be greater than the minimum distance. A first width (W1) of the plug holes 122 may be greater than a minimum width that can be obtained by a photolithography process.

Only the first plug holes 122a may be adjacent to one another in the first direction (A1). At this time, the second plug holes 122b may be disposed in the first direction (A1), but each of the second plug holes 122b may be disposed between the first plug holes 122a adjacent to one another in the first direction (A1) and is spaced apart from the first plug holes 122a in a second direction (A2) perpendicular to the first direction (A1). The first and second plug holes 122a and 122b may be disposed at a sufficiently wide interval so as not to be overlapped with one another.

Plugs 130 filling the plug holes 122 with conductive material may be formed. The plugs 130 may include first plugs 130a filling the first plug holes 122a and second plugs 130b filling the second plug holes 122b. The plugs 130 may be formed by performing a step of forming a conductive layer and a step of planarizing the conductive layer.

Figure 5:
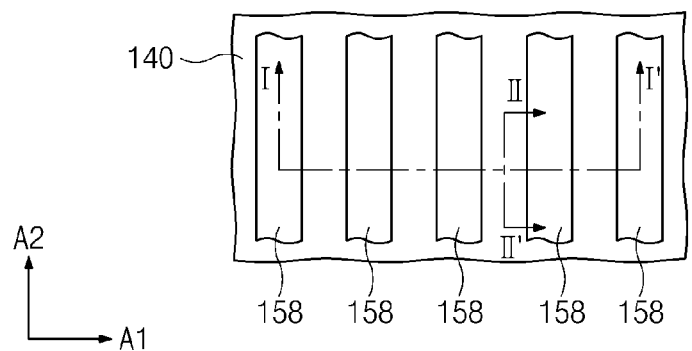
Figure 6:
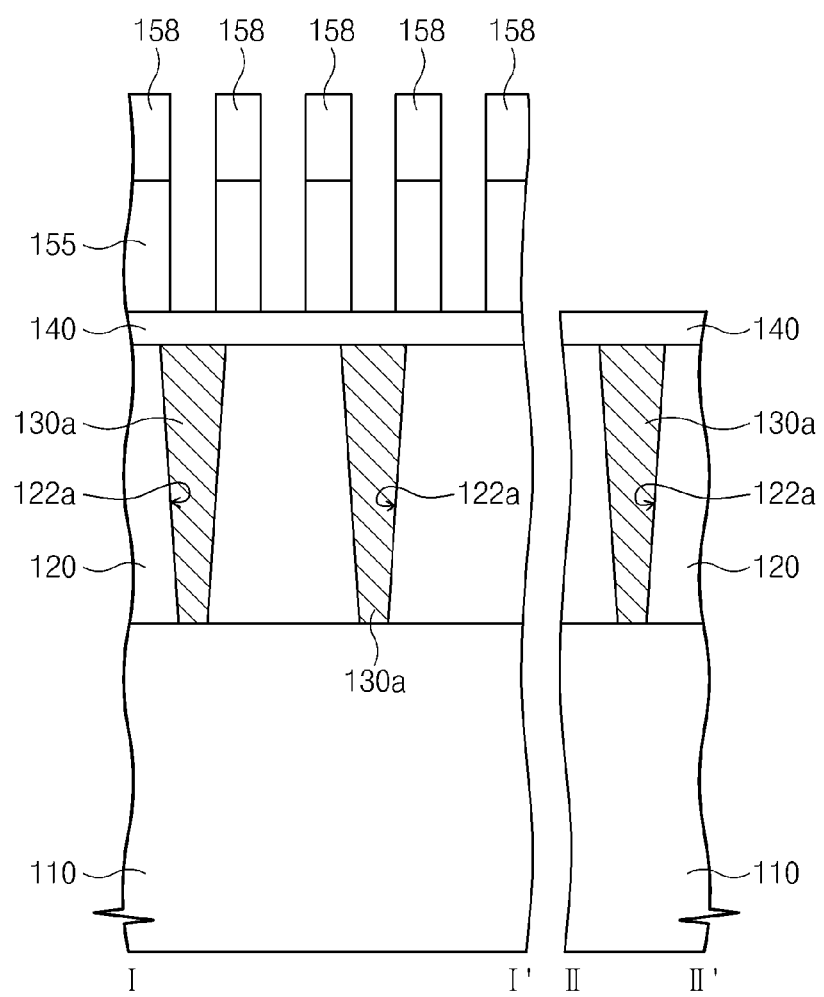

Referring to FIGS. 5 and 6, a protection layer 140 may be formed on the plugs 130 and the interlayer insulating layer 120. A molding layer (not shown) may be formed on the protection layer 140 and hard mask patterns 158 may be formed on the molding layer. The hard mask patterns 158 may be formed by a photolithography process and an etching process. The molding layer is etched using the hard mask patterns 158 to form the molding patterns 155. The molding patterns 155 may extend in the second direction (A2). The molding patterns 155 may have a line shape and may be disposed at a minimum interval that can be obtained by a photolithography process. The molding patterns 155 expose the protection layer 140 on the plugs 130 and may be overlapped with an edge of the plugs 130. The molding patterns 155 may include a material having an etching selectivity with respect to the protection layer 140. For example, the protection layer 140 may include a silicon nitride and the molding patterns 155 may include a silicon oxide.

Figure 7:
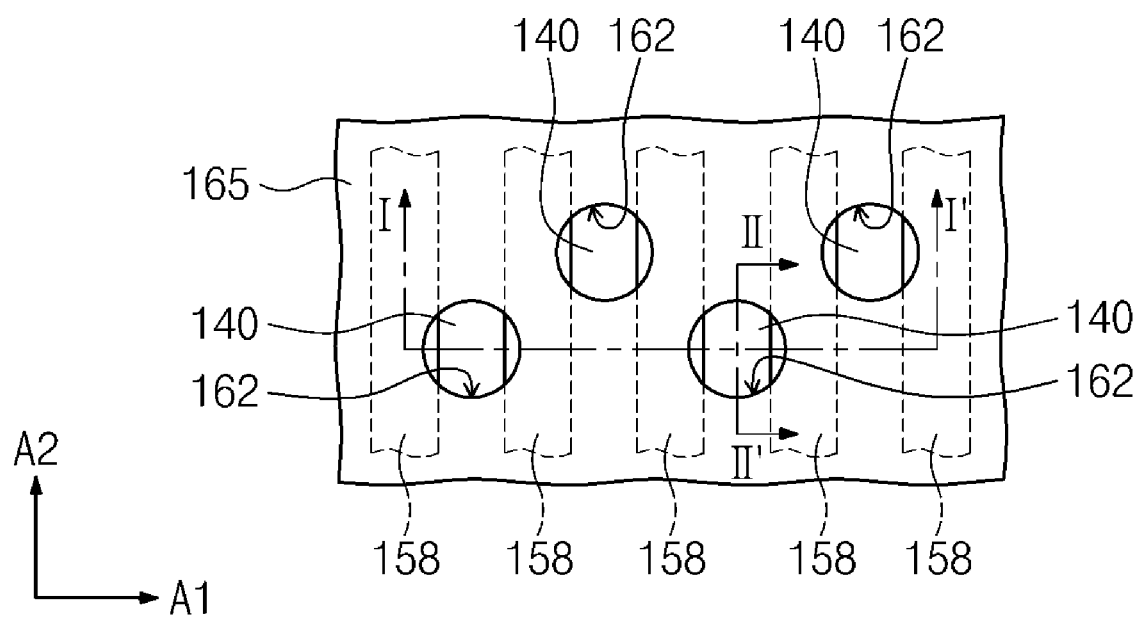
Figure 8:
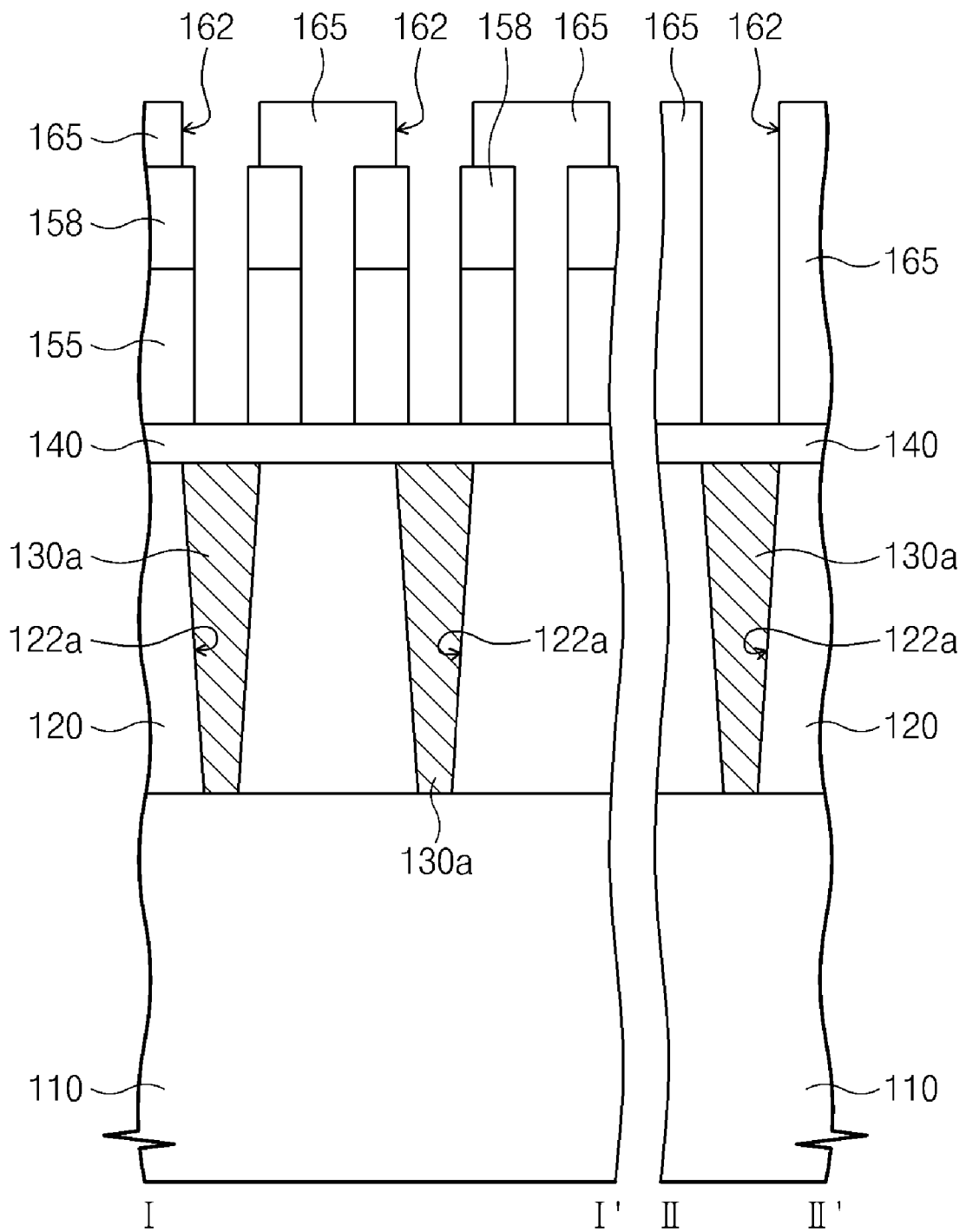

Referring to FIGS. 7 and 8, a mask layer (not shown) may be formed on the protection layer 140 and the hard mask patterns 158 so as to fill a space between the molding patterns 155. The mask layer may include a photoresist. The mask layer may include a spin-on hard mask material layer and a photoresist layer that are sequentially stacked. After a space between the molding patterns 155 is first filled with a spin-on hard mask material having a superior gap-fill characteristic, the photoresist layer may be formed. A reflection preventing layer may be interposed between the spin-on hard mask material layer and the photoresist layer so as to improve an efficiency of an exposure process.

A photolithography process may be applied to the photoresist layer. A portion of the photoresist layer is selectively removed to form a photoresist pattern and the spin-on hard mask material layer exposed by the photoresist pattern may be etched. As a result, a mask pattern 165 including openings 162 may be formed. The openings 162 may selectively expose the protection layer 140 on the plugs 130. The openings 162 may expose the hard mask patterns 158 being on the molding patterns 155 and overlapped with the plugs 130. For example, the openings 162 may be formed using the exposure mask used in forming the plug holes 122. In this case, the openings 162 may be formed to have a shape, a size (e.g. a width) and an arrangement as the plug holes 122 or the plugs 130a and 130b.

Figure 9:
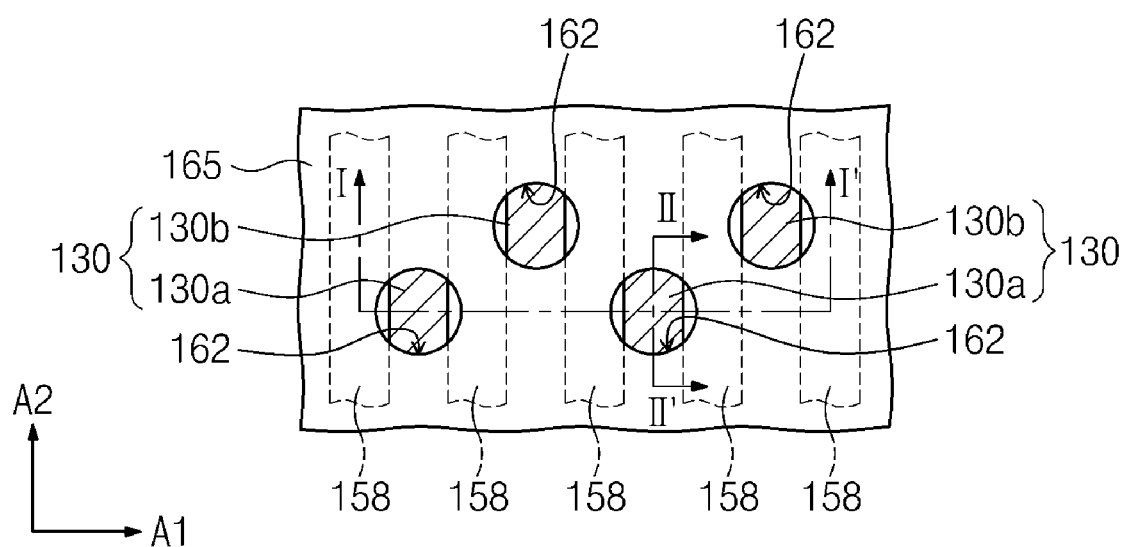
Figure 10:
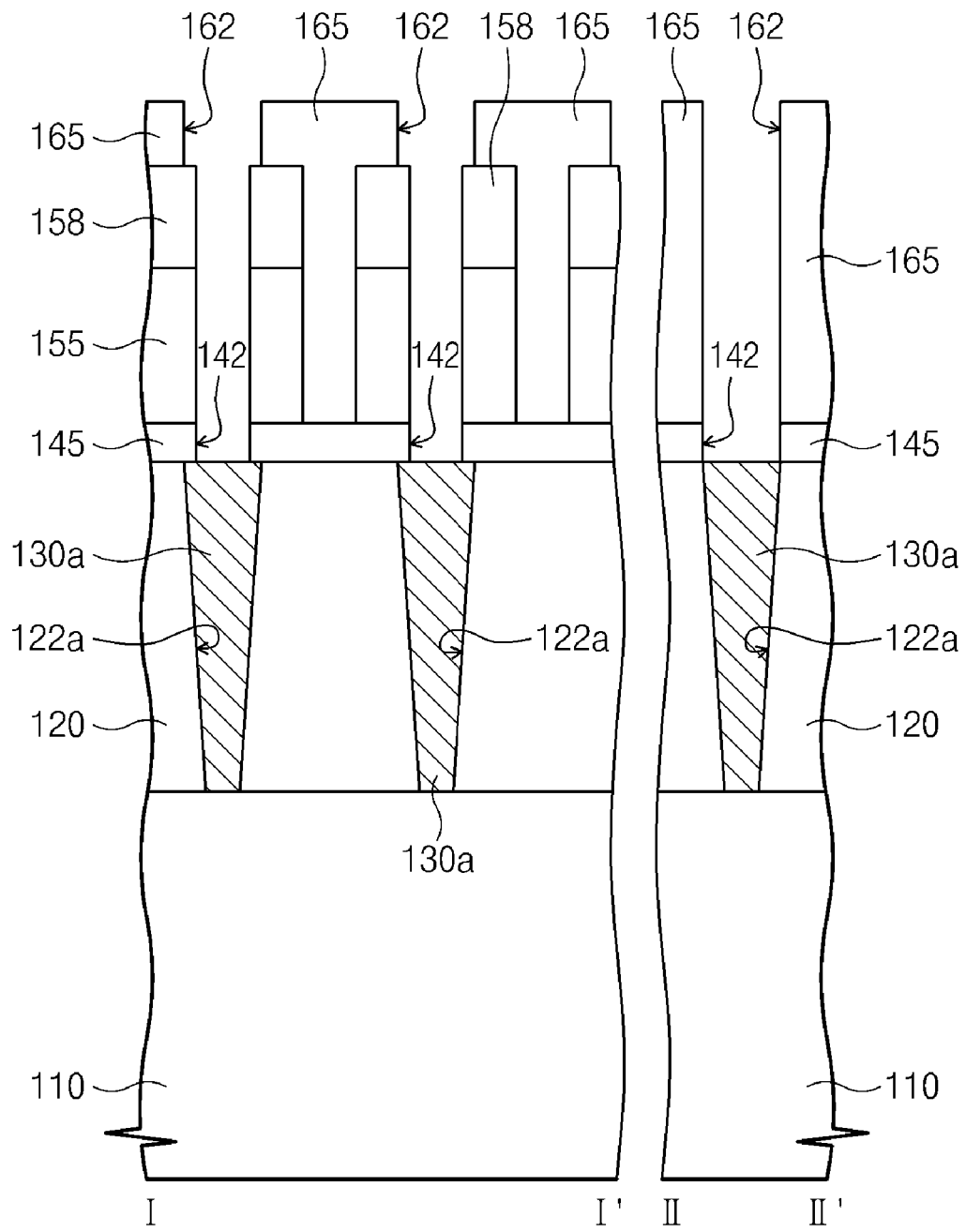

Referring to FIGS. 9 and 10, the protection layer 140 exposed by the openings 162 may be selectively etched using the mask pattern 165 and the hard mask pattern 158. The protection layer 140 may include a material having an etching selectivity with respect to the mask pattern 165, the hard mask patterns 158 and the plugs 130. The protection layer 140 is etched to form a protection pattern 145 exposing a top surface of the plugs 130.

Figure 11:
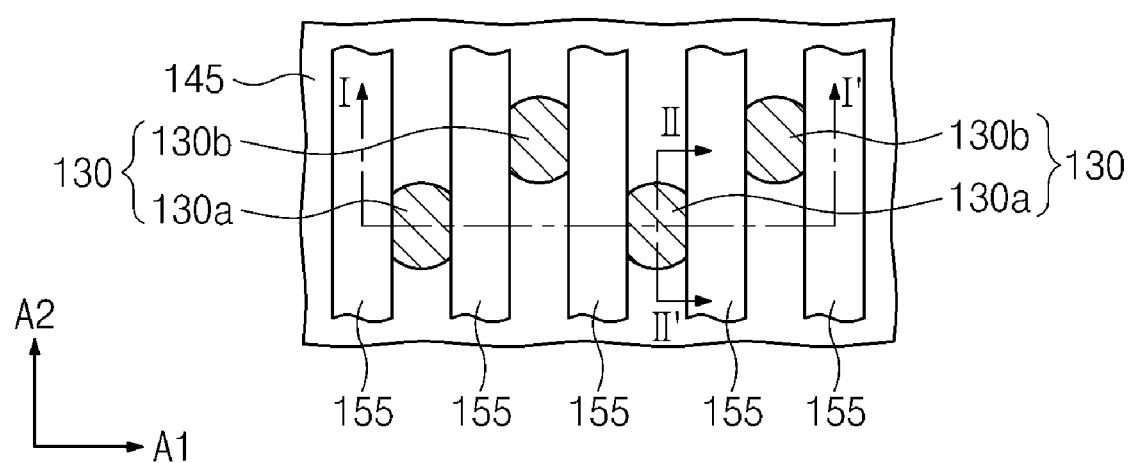
Figure 12:
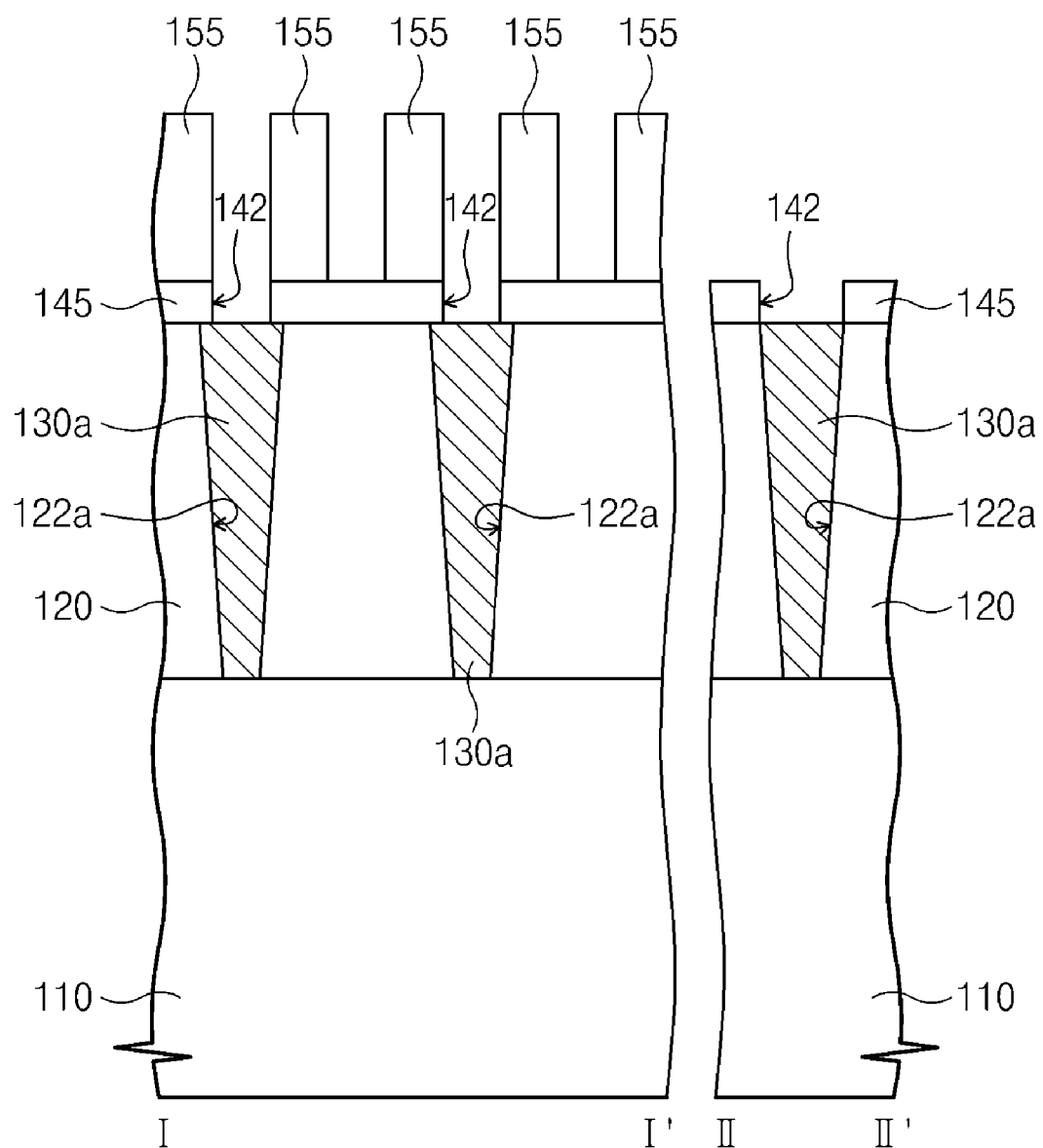
Figure 13:
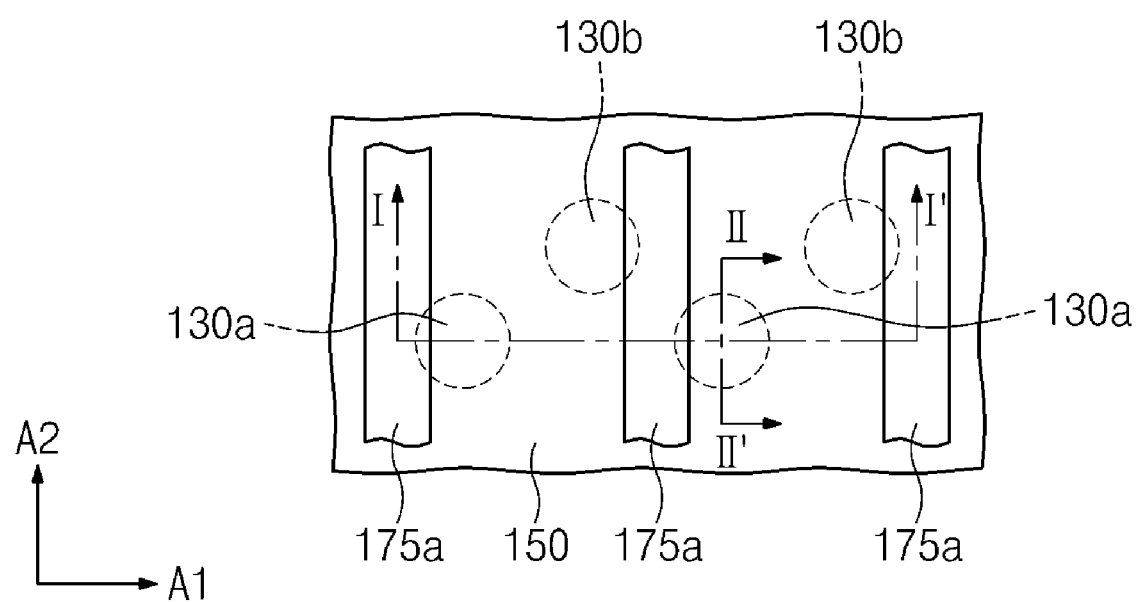
FIGS. 13, 15, 17 and 19 are top plan views illustrating another method of manufacturing a semiconductor device according to an embodiment of the present invention.
Figure 14:
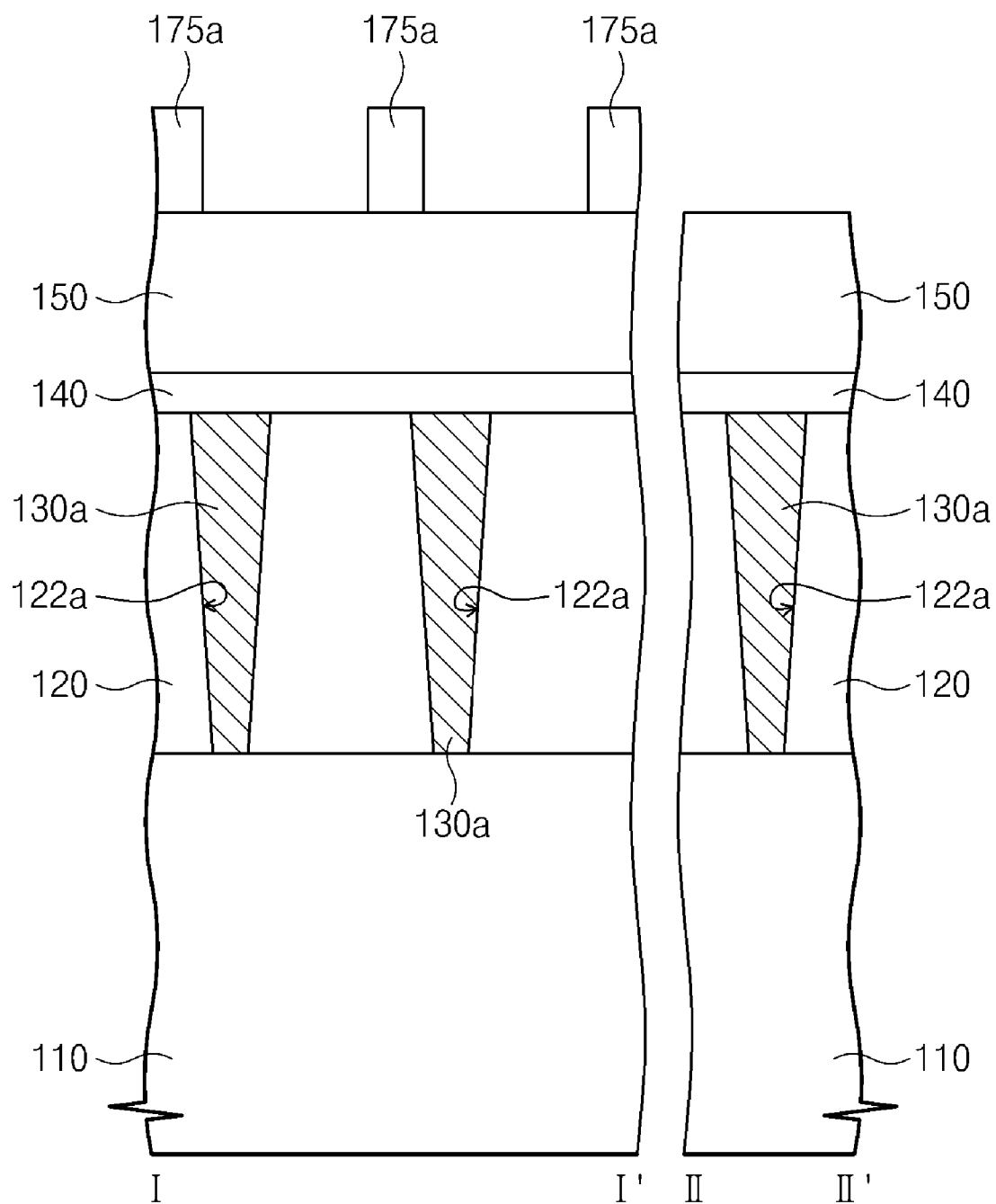
FIGS. 14, 16, 18 and 20 are cross sectional views taken along the lines I-I' and II-II' of FIGS. 13, 15, 17 and 19, respectively, illustrating another method of manufacturing a semiconductor device according to an embodiment of the present invention.

Referring to FIGS. 11 and 12, the mask pattern 165 and the hard mask pattern 158 may be removed. The molding patterns 155 may be disposed on the protection pattern 145. Protection pattern openings 142 of the protection pattern 145 exposing a top surface of the plugs 130 may have the same interval as the molding pattern 155 in the first direction (A1) and the same width as the plugs 130 in the second direction (A2). The protection pattern openings 142 may exist only between the molding patterns 155.

Referring to FIGS. 1, 2, 11 and 12 again, interconnections 195 may be formed between the molding patterns 155. The interconnections 195 may include a connection portion 192 filling the protection pattern openings 142. The interconnections 195 may include conductive material, for example a metal material. The metal material has a low resistance, for example may include aluminum, aluminum alloy or copper. The metal material may have a low ion migration in the interconnections. The interconnections 195 may be formed by a deposition process and a planarization process. A copper interconnection may be formed by a copper damascene process. A barrier layer (not shown) may be interposed between the interconnections 195 and the molding patterns 155, between the interconnections 195 and the protection pattern 145 and between the interconnections 195 and the plugs 130. The barrier layer can improve a contact characteristic and prevent a diffusion of a metal ion and an impurity.

Referring to FIGS. 1, 2, and 13 through 20, another method of manufacturing a semiconductor device according to the present invention will be described.

Referring to FIGS. 13 through 18, molding patterns 155 may be formed at an interval smaller than a minimum interval that can be obtained by a photolithography process. The molding patterns 155 may be formed using hard mask patterns 175a and 175b formed by a double patterning technique (DPT). The hard mask patterns 175a and 175b may be formed to have a same width.

Referring to FIGS. 13 and 14 again, a protection layer 140 may be formed on a resultant structure of FIGS. 3 and 4. A molding layer 150 may be formed on the protection layer 140. First hard mask patterns 175a may be formed on the molding layer 150. The molding layer 150 may include material having an etching selectivity with respect to the first hard mask patterns 175a. For example, the molding layer 150 may include silicon oxide and the first hard mask patterns 175a may include polysilicon. The first hard mask patterns 175a may extend in the second direction (A2). The first hard mask patterns 175a may have a line shape and may be disposed at an interval greater than a minimum interval that can be obtained by a photolithography process.

Figure 15:
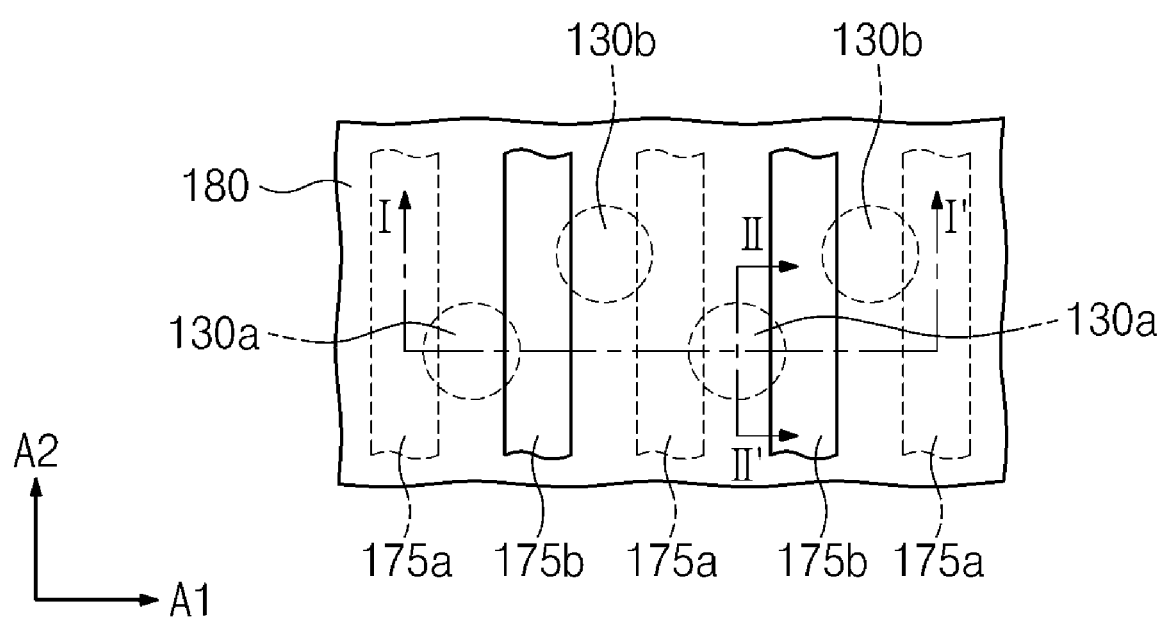
Figure 16:
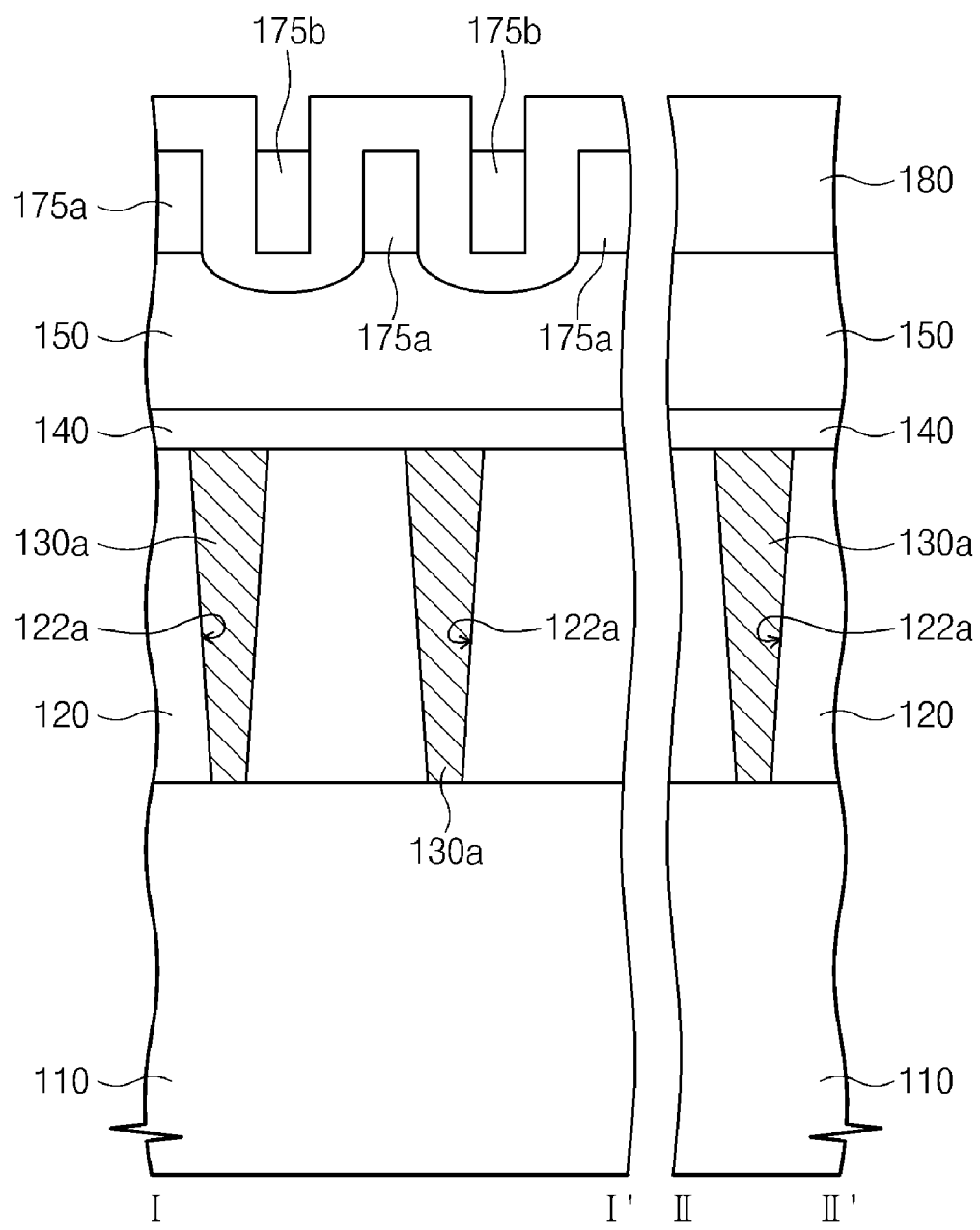
Figure 17:
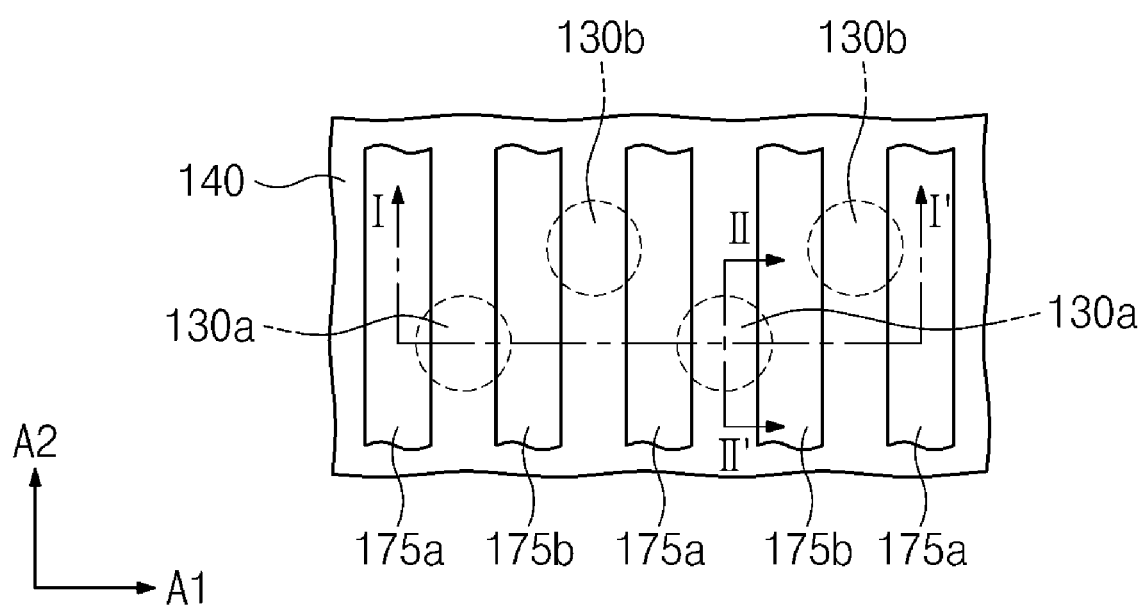
Figure 18:
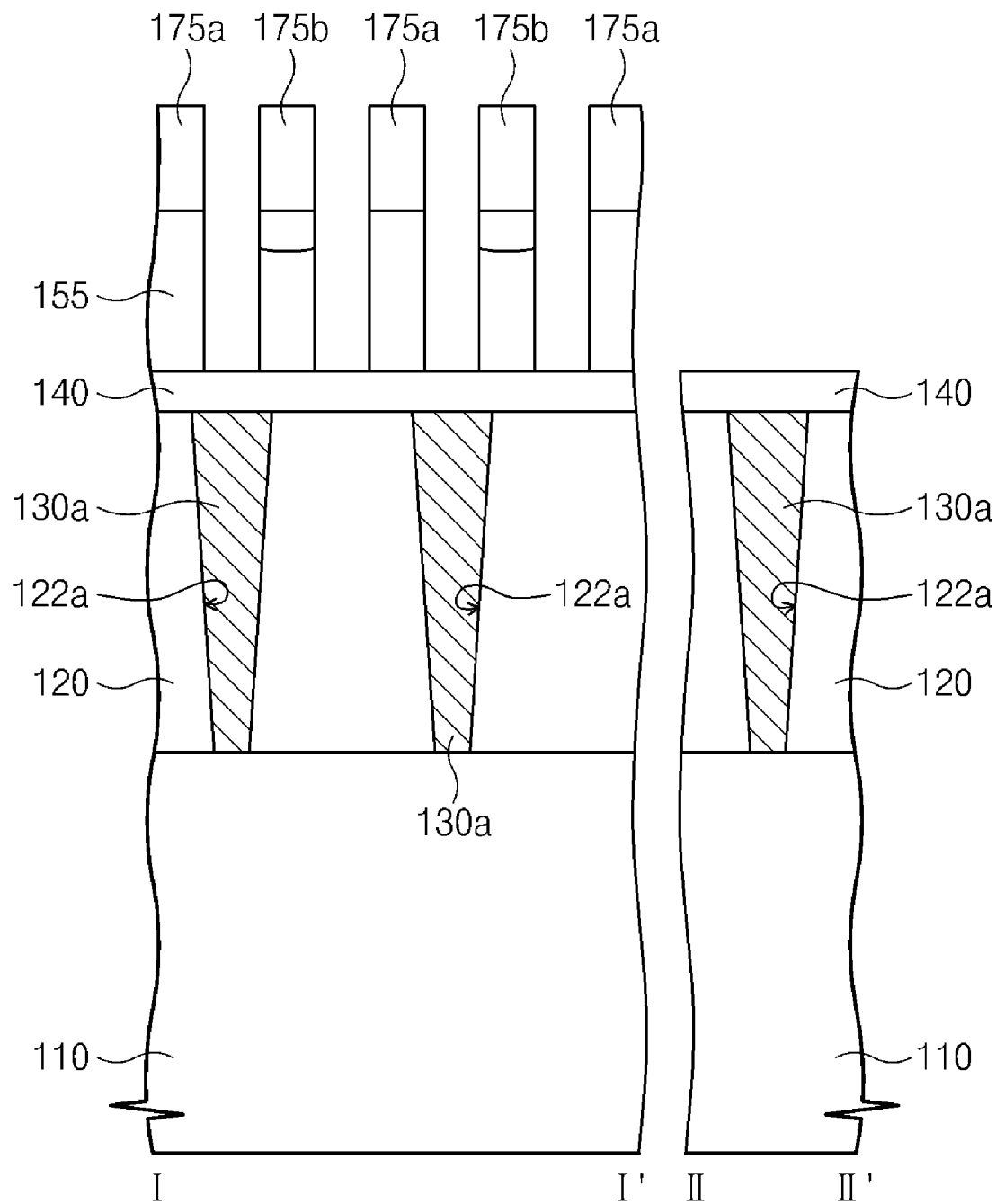

Referring to FIGS. 15 and 16, second hard mask patterns 175b extending in the second direction (A2) may be formed between the first hard mask patterns 175a. The second hard mask patterns 175b may include the same material as the first hard mask patterns 175a.

According to an embodiment, the molding layer 150 exposed by the first hard mask patterns 175a may be recessed. The molding layer 150 may be recessed as much as the distance between the hard mask patterns 175a and 175b. A spacer layer 180 may be conformally formed on the first hard mask patterns 175a and the recessed molding layer 150. The spacer layer 180 may be formed to have a same thickness as the recessed depth of the molding layer 150. The spacer layer 180 may include the same material as the molding layer 150. A space having the same width as the width of the first hard mask patterns 175a may be formed between the first hard mask patterns 175a by the spacer layer 180. After the space is filled with polysilicon, it is recessed to form second hard mask patterns 175b having a top surface even with the first hard mask pattern 175a. The second hard mask patterns 175b may have a bottom surface even with a bottom surface of the first hard mask patterns 175a by the spacer layer 180.

Referring to FIGS. 17 and 18 again, the spacer layer 180 and the molding layer 150 are anisotropically etched using the hard mask patterns 175a and 175b to expose the protection layer 140. The molding patterns 155 may be formed on the protection layer 140 by the anisotropical etching. As a result, structures including the molding patterns 155 and the hard mask patterns 175a and 175b that are sequentially stacked on the protection layer 140 may be formed. The structures may expose the protection layer 140 on the plugs 130 and may be overlapped with an edge of the plugs 130. The protection layer 140 may include having an etching selectivity with respect to the hard mask patterns 175a and 175b. For example, the protection layer 140 may include silicon nitride and the hard mask patterns 175a and 175b may include polysilicon.

Figure 19:
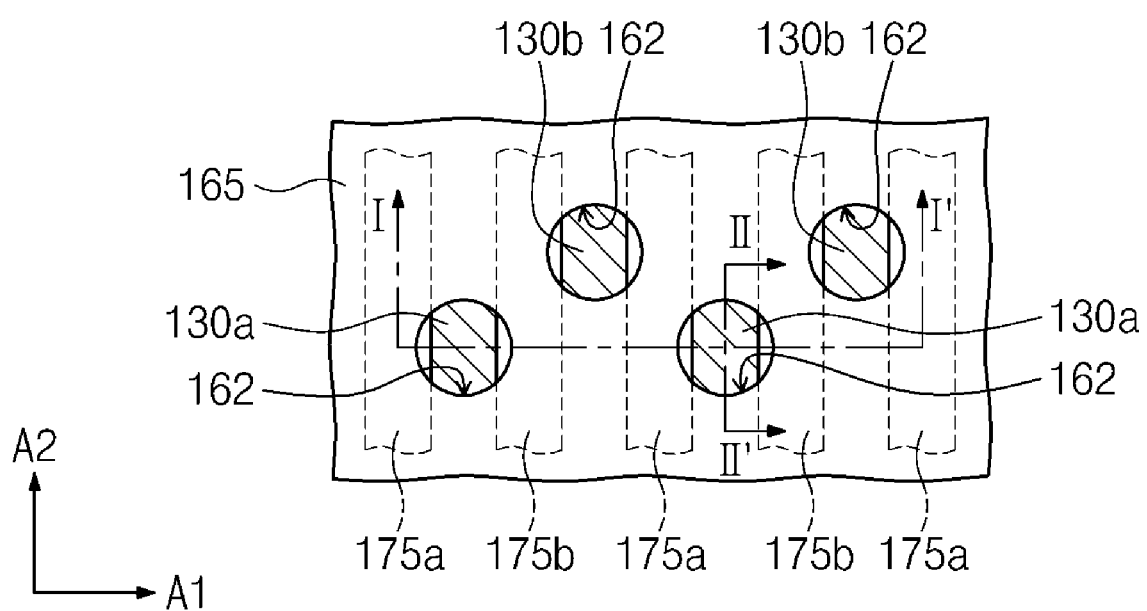
Figure 20:
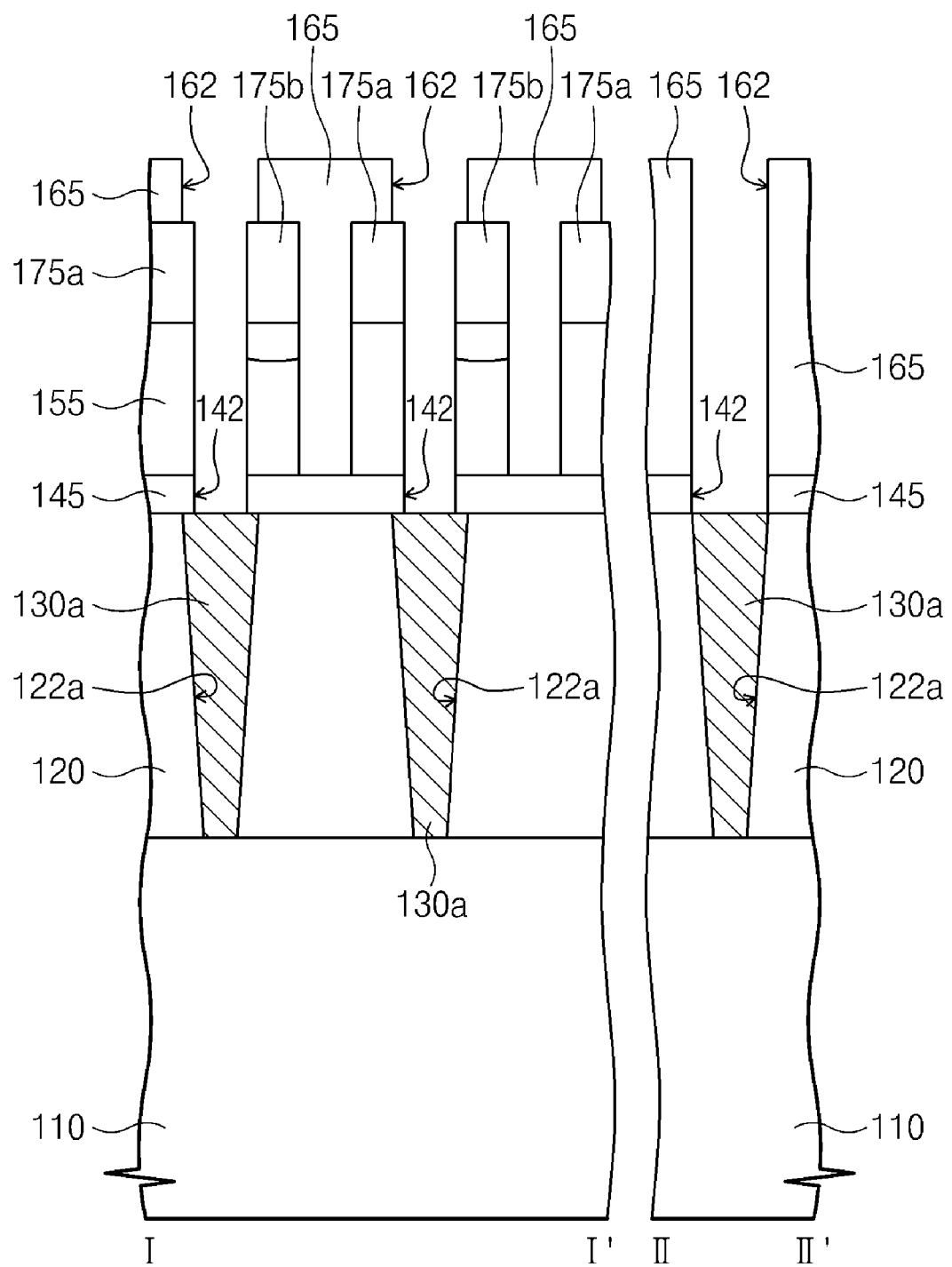

Referring to FIGS. 19 and 20, a mask layer (not shown) may be formed on the structures and the protection layer 140. The mask layer may include a photoresist. Alternatively, the mask layer may include a spin-on hard mask material layer and a photoresist layer that are sequentially stacked. After a space between the structures is first filled with a spin-on hard mask material having a superior gap fill characteristic, the photoresist layer may be formed. A preventing reflection layer may be interposed between the spin-on hard mask material layer and the photoresist layer.

A photolithography process may be applied to the photoresist layer. A portion of the photoresist layer is selectively removed to form a photoresist pattern and the spin-on hard mask material layer exposed by the photoresist pattern may be etched. As a result, a mask pattern 165 having openings 162 may be formed. The openings 162 may selectively expose the protection layer 140 on the plugs 130. The openings 162 may expose the structures overlapped with the plugs 130. The openings 162 may be formed to have a shape, a size and a disposition equal to the plug holes 122 or the plugs 130a and 130b. For example, the openings 162 may be formed using the exposure mask used in forming the plug holes 122.

The protection layer 140 exposed by the openings 162 may be selectively etched using the mask pattern 165 and the hard mask pattern 175a and 175b. The protection layer 140 may include a material having an etching selectivity with respect to the mask pattern 165, the hard mask patterns 175a and 175b, and the plugs 130. The protection layer 140 is etched to form a protection pattern 145 exposing a top surface of the plugs 130.

Referring to FIGS. 1, 2, 19 and 20 again, the mask pattern 165 may be removed. The hard mask patterns 175a and 175b may also be removed. As a result, the molding patterns 155 may be exposed. The molding patterns 155 may be disposed on the protection pattern 145. Protection pattern openings 142 of the protection pattern 145 exposing a top surface of the plugs 130 may have the same interval as the molding pattern 155 in the first direction (A1) and the same width as the plugs 130 in the second direction (A2). The protection pattern openings 142 may exist only between the molding patterns 155.

Interconnections 195 may be formed between the molding patterns 155. The interconnections 195 may include a connection portion 192 filling the protection pattern openings 142. The interconnections 195 may include conductive material, for example a metal material. The metal material may have a low resistance and a low ion migration in the interconnections. The metal material may include aluminum, aluminum alloy or copper. The interconnections may be formed by a deposition process and a planarization process. A copper interconnection may be formed by a copper damascene process. A barrier layer (not shown) may be interposed between the interconnections 195 and the molding patterns 155, between the interconnections 195 and the protection pattern 145 and between the interconnections 195 and the plugs 130. The barrier layer can improve a contact characteristic and prevent a diffusion of a metal ion and an impurity.

Figure 21:
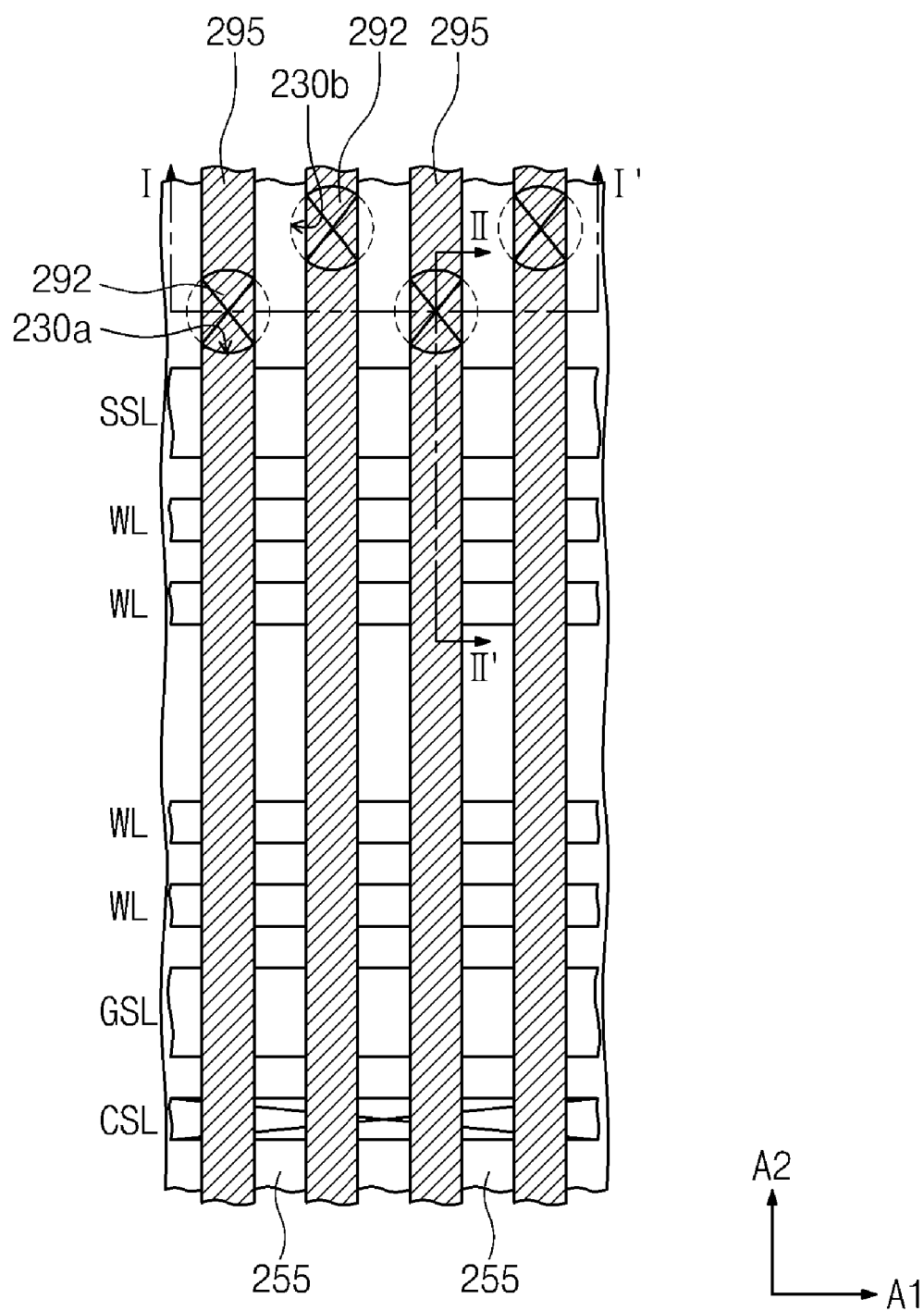
FIG. 21 is a top plan view of a semiconductor device according to another embodiment of the present invention.
Figure 22:
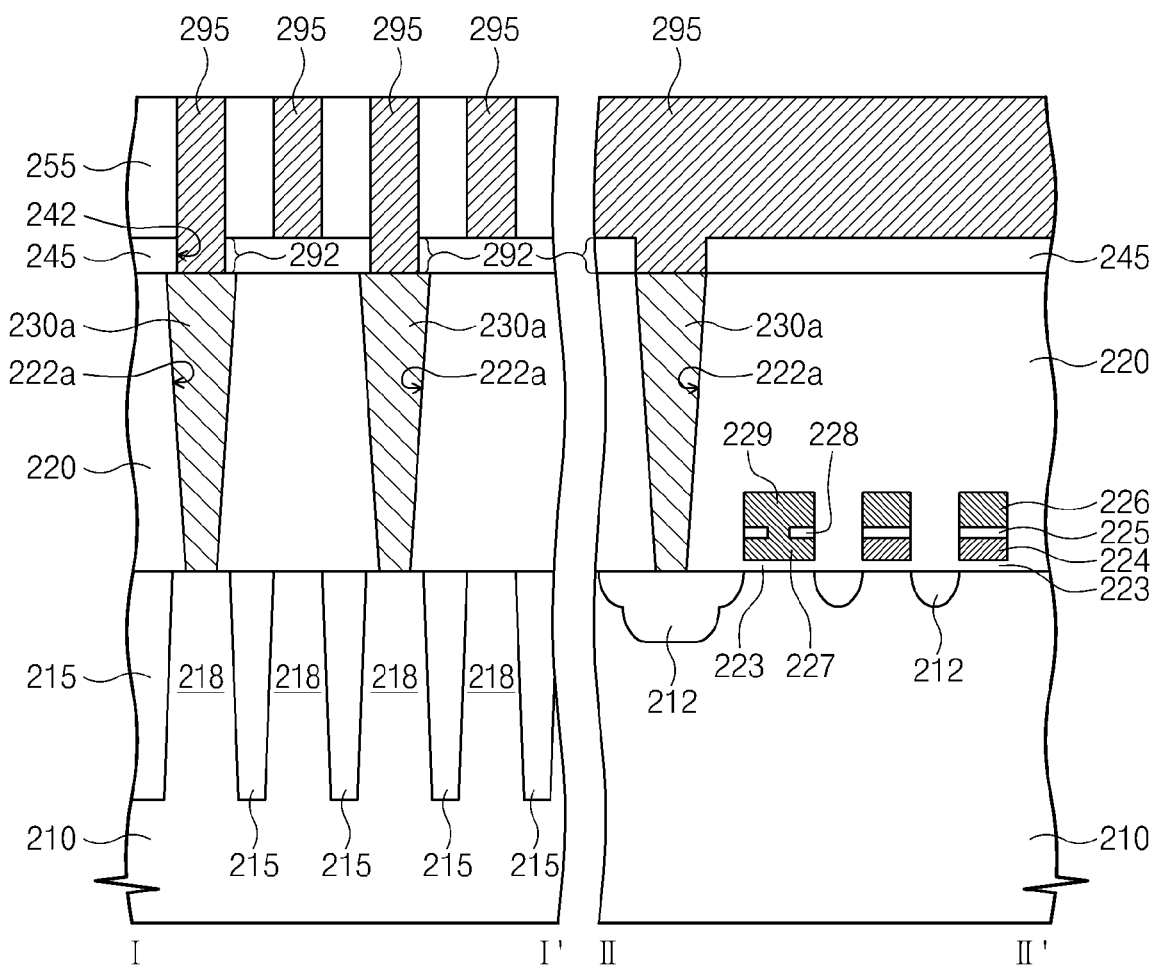
FIG. 22 is a cross sectional view taken along the lines I-I' and II-II' of FIG. 21 illustrating a semiconductor device according to another embodiment of the present invention.

Referring to FIGS. 21 and 22, a semiconductor device according to another embodiment of the present invention will be described. Hereinafter, the descriptions of common features already described above will be briefly discussed.

Plugs 230 which are in contact with a substrate 210 may be disposed in an interlayer insulating layer 220 on the substrate 210.

The substrate 210 may include active regions 218 defined by a device isolation layer 215. A string selection line (SSL), a ground selection line (GSL) and word lines (WL) between the string selection line (SSL) and the ground selection line (GSL) may be disposed on the substrate 210. The lines (SSL, GSL, WL) may extend in a first direction (A1) and the active regions 218 may extend in a second direction (A2) perpendicular to the first direction (A1).

The word lines (WL) may include a gate insulating layer 233, a floating gate 224, an inter-gate dielectric layer 225 and a control gate 226 that are sequentially stacked. The selection lines (SSL, GSL) may include a gate insulating layer 233, a first gate 227, a dielectric layer 228 and a second gate 229. The first gate 227 and the second gate 229 may be electrically connected to each other by a butting plug.

Impurity regions 212 may be formed in the active regions 218 between the lines (GSL, SSL, WL). The impurity regions 212 may include source/drain regions, a diffusion region and a common source line.

Plugs 230 in contact with a substrate 210 may be disposed in an interlayer insulating layer 220. The plugs 230 may include first plugs 230a and second plugs 230b. The plugs 230 may be disposed in zigzags. The plugs 230 may be spaced a first distance (D1) apart from one another to extend in a first direction (A1). The first distance (D1) may be a minimum distance that can be obtained by a photolithography process. The first distance (D1) may also be greater than the minimum distance. At this time, a first width (W1) of the plugs 230 may be greater than a minimum width that can be obtained by a photolithography process.

Only the first plugs 230a may be adjacent to one another in the first direction (A1). At this time, the second plugs 230b may be disposed in the first direction (A1), but each of the second plug 230b may be disposed between the first plug 230a adjacent to one another in the first direction (A1) and is spaced apart from the first plugs 230a in a second direction (A2) perpendicular to the first direction (A1). The first and second plugs 230a and 230b may be disposed at a sufficiently wide interval so as not to be overlapped with one another.

A protection pattern 245 including a protection pattern opening 242 may be disposed on the plugs 230 and the interlayer insulating layer 220. A bottom surface of the protection pattern opening 242 may be constituted of a portion of a top surface of the plug 230. The protection pattern opening 242 may have a minimum width or less, in the first direction (A1), that can be obtained by a photolithography process. The protection pattern opening 242 may have the same width as the plugs 230 in the second direction (A2). A width of the protection pattern opening 242 may be greater in the second direction (A2) than in the first direction (A1). An edge of a top surface of the plug 230 may be overlapped with the protection pattern 245 in the first direction (A1). Accordingly, the protection pattern 245 may cover the edge of the top surface of the plug 230 in the first direction (A1) and the interlayer insulating layer 220.

Molding patterns 255 may be disposed on the protection pattern 245 in the second direction (A2). The molding patterns 255 may be disposed with an interval that is the same with a width of the protection pattern opening 242 in the first direction (A1) where the protection pattern opening 242 may be disposed between the molding patterns 255. A side surface of the molding pattern 255 and a side surface of the protection pattern opening 242 may be aligned with the same side surface. The molding pattern 255 may be overlapped with an edge of a top surface of the plug 230 in the first direction (A1). The protection pattern 245 may include a silicon nitride and the molding pattern 255 may include a silicon oxide.

Interconnections 295 may be disposed between the molding patterns 255. The interconnections 295 may include a connection portion 292 electrically connected to the plugs 230 by filling the protection pattern opening 242, respectively. The connection portion 292 may have the same width as the interconnections 295 in the first direction (A1) and may have the same width as the plugs 230 (e.g., a top surface of the plug) in the second direction (A2). The metal material may have a low resistance and a low ion migration in the interconnections. The metal material may include aluminum, aluminum alloy or copper.

Referring to FIGS. 21 through 30, a method of manufacturing a semiconductor device according to another embodiment of the present invention will be described. Hereinafter, the descriptions of common features already described above will be briefly discussed.

Figure 23:
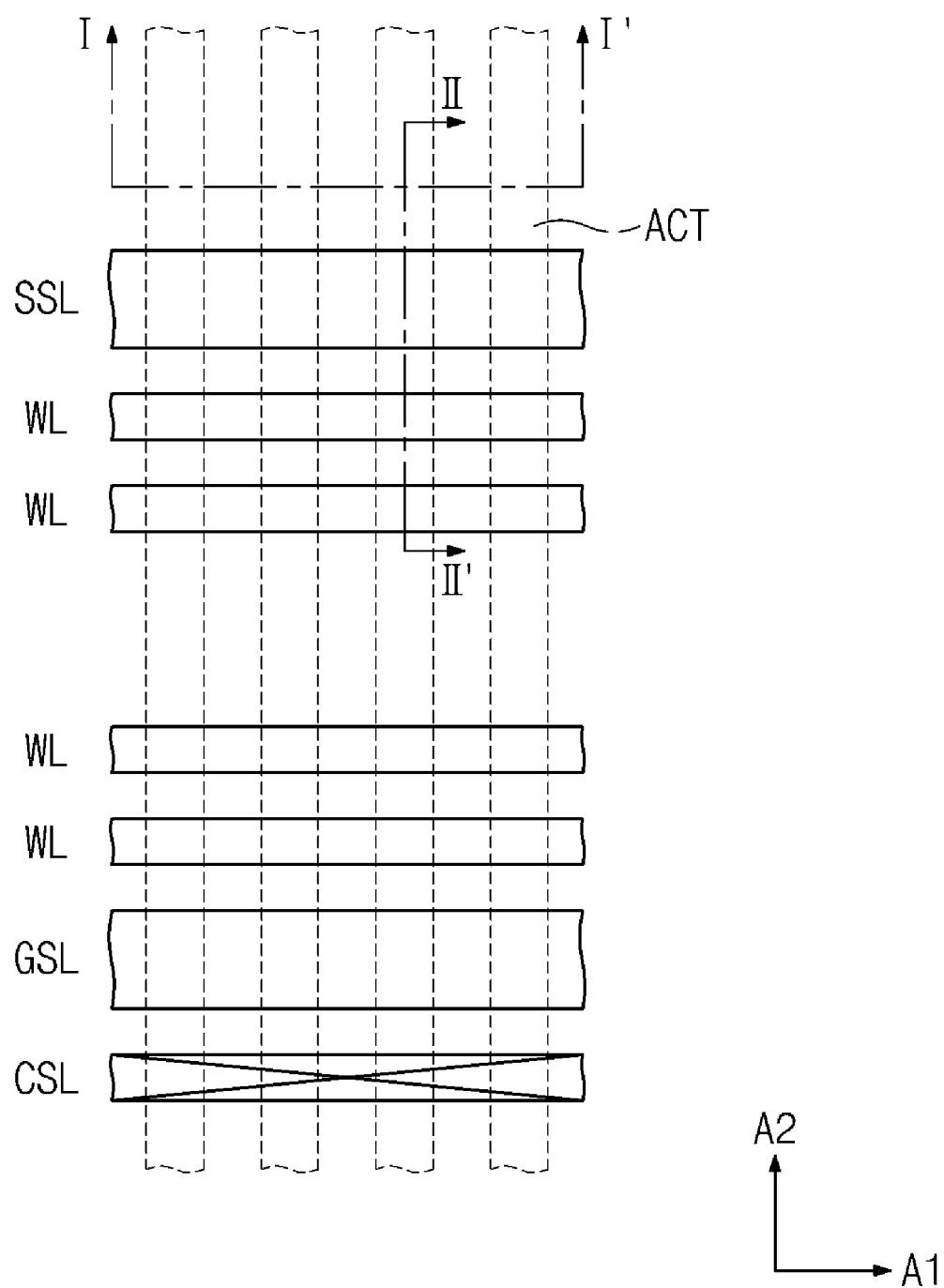
FIGS. 23, 25, 27 and 29 are top plan views illustrating a method of manufacturing a semiconductor device according to another embodiment of the present invention.
Figure 24:
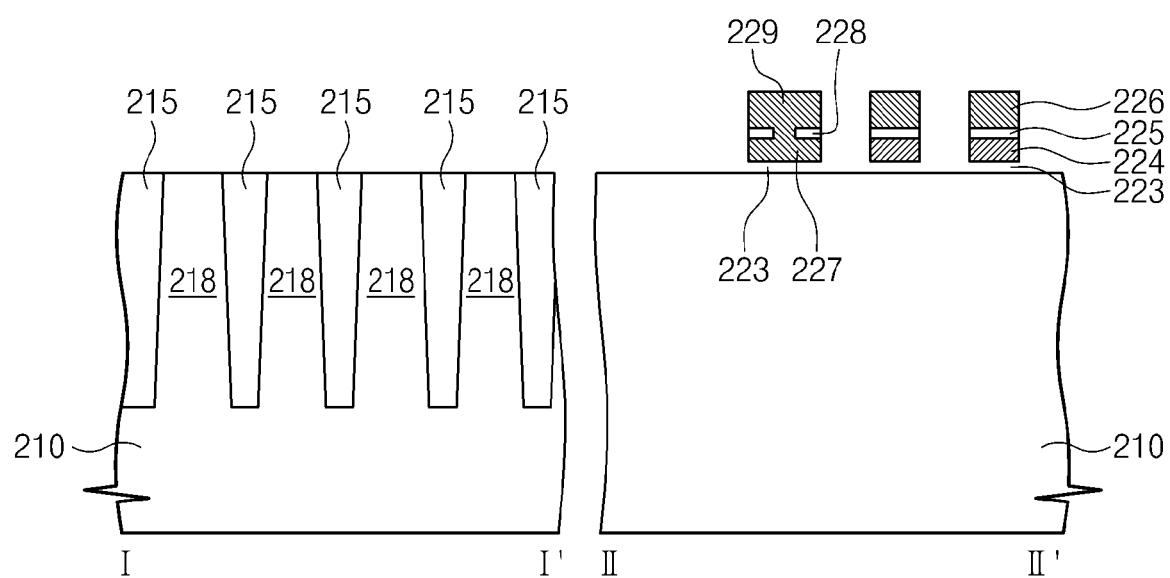
FIGS. 24, 26, 28 and 30 are cross sectional views taken along the lines I-I' and II-II' of FIGS. 23, 25, 27 and 29, respectively, illustrating a semiconductor device according to another embodiment of the present invention.

Referring to FIGS. 23 and 24, a string selection line (SSL), a ground selection line (GSL) and word lines (WL) between the string selection line (SSL) and the ground selection line (GSL) may be disposed on a substrate 210 including a device isolation layer 215. The device isolation layer 215 may be formed by a shallow trench isolation (STI) process and active regions 218 may be defined by the device isolation layer 215. The lines (SSL, GSL, WL) may extend in a first direction (A1) and the active regions 218 may extend in a second direction (A2) crossing the first direction (A1).

The word lines (WL) may include a gate insulating layer 223, a floating gate 224, an inter-gate dielectric layer 255 and a control gate 226 that are sequentially stacked. The gate insulating layer 223 may be formed by a thermal oxidation process. A conductive pattern (not shown) extending in the second direction (A2) may be formed. After forming an inter-gate dielectric layer and a conductive layer on the resultant structure, the word lines (WL) may be formed by patterning them. The selection lines (SSL, GSL) may include a gate insulating layer 223, a first gate 227, a dielectric layer 228 and a second gate 229. The first gate 227, the dielectric layer 228 and the second gate 229 may be formed when the floating gate 224, the inter-gate dielectric layer 225 and the control gate 226 are formed, simultaneously. The first gate 227 and the second gate 229 may be electrically connected to each other by a butting process.

Figure 25:
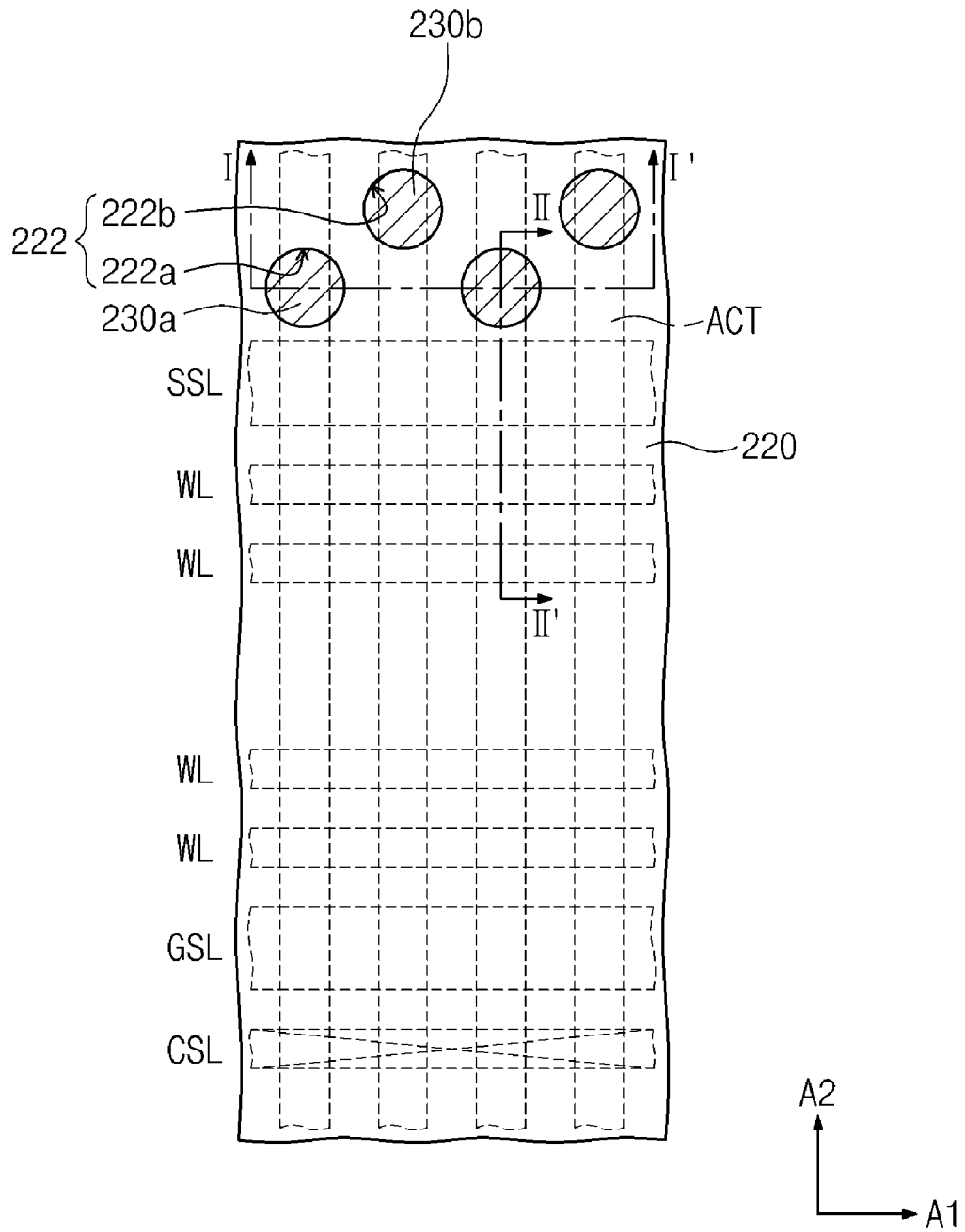
Figure 26:
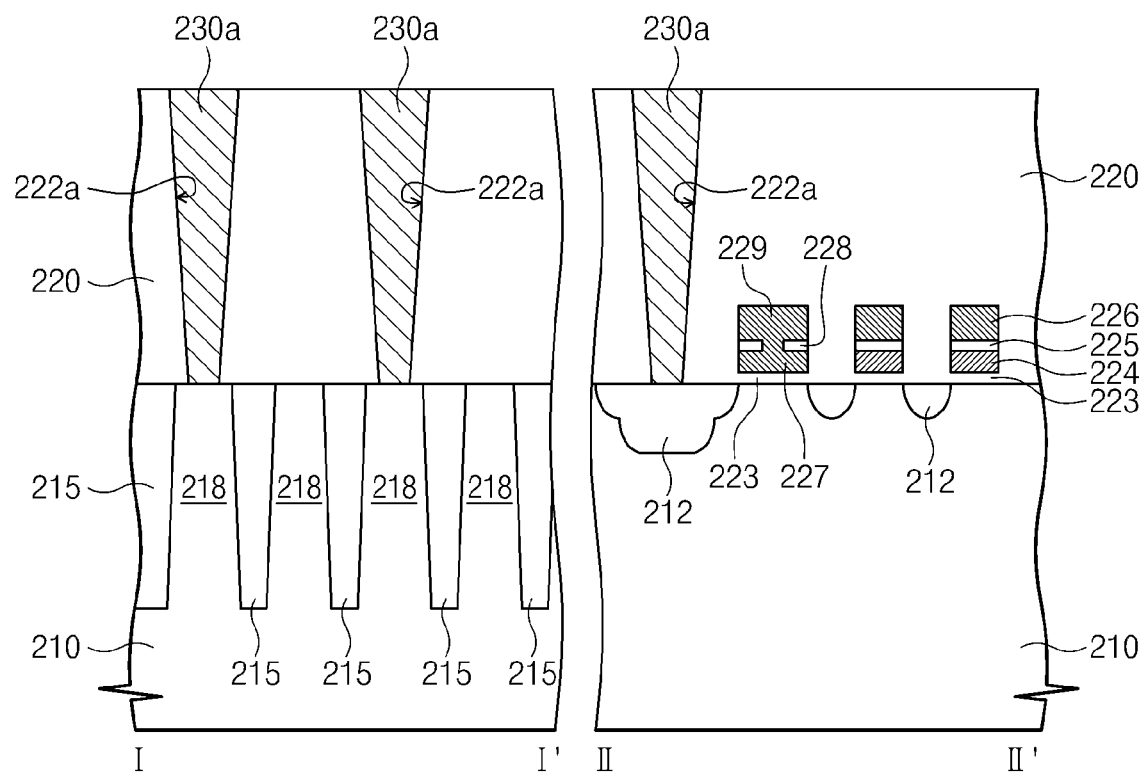

Referring to FIGS. 25 and 26, impurity regions 212 may be formed in the active regions 218 exposed by the lines (GSL, SSL, WL) through an impurity implantation process. The impurity regions 212 may include source/drain regions, a diffusion region and a common source line.

An interlayer insulating layer 220 may be formed on the substrate 210. Plug holes 222 exposing a portion of the substrate 210 may be formed in an interlayer insulating layer 220. The plug holes 222 may include first plug holes 222a and second plug holes 222b. The plug holes 222 may be disposed in zigzags. The plug holes 222 may be spaced a first distance (D1) apart from one another and extend in a first direction (A1). The first distance (D1) may be a minimum distance that can be obtained by a photolithography process. The first distance (D1) may also be greater than the minimum distance. At this time, a first width (W1) of the plug holes 222 may be greater than a minimum width that can be obtained by a photolithography process.

Only the first plug holes 222a may be adjacent to one another in the first direction (A1). The second plug holes 222b may be disposed in the first direction (A1), but each of the second plug holes 222b may be disposed between the first plug holes 222a adjacent to one another in the first direction (A1) and is spaced apart from the first plug holes 222a in a second direction (A2) perpendicular to the first direction (A1). The first and second plug holes 222a and 222b may be disposed at a sufficiently wide interval so as not to be overlapped with one another.

Plugs 230 may be formed by filling the plug holes 222 with a conductive material. The plugs 230 may include first plugs 230a in the first plug holes 222a and second plugs 230b in the second plug holes 222b. The plugs 230 may be formed by performing a step of forming a conductive layer and a step of planarizing the conductive layer.

Figure 27:
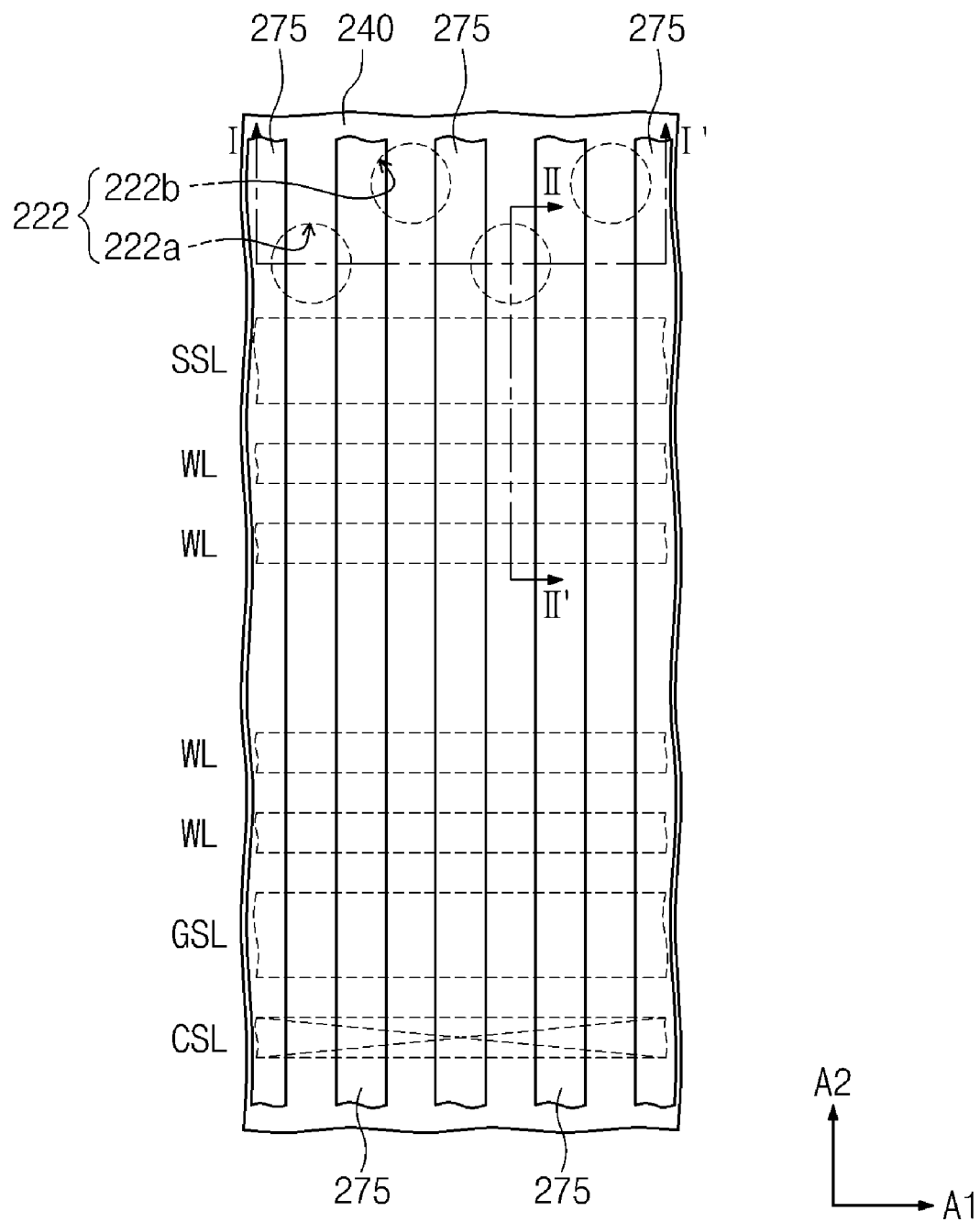
Figure 28:
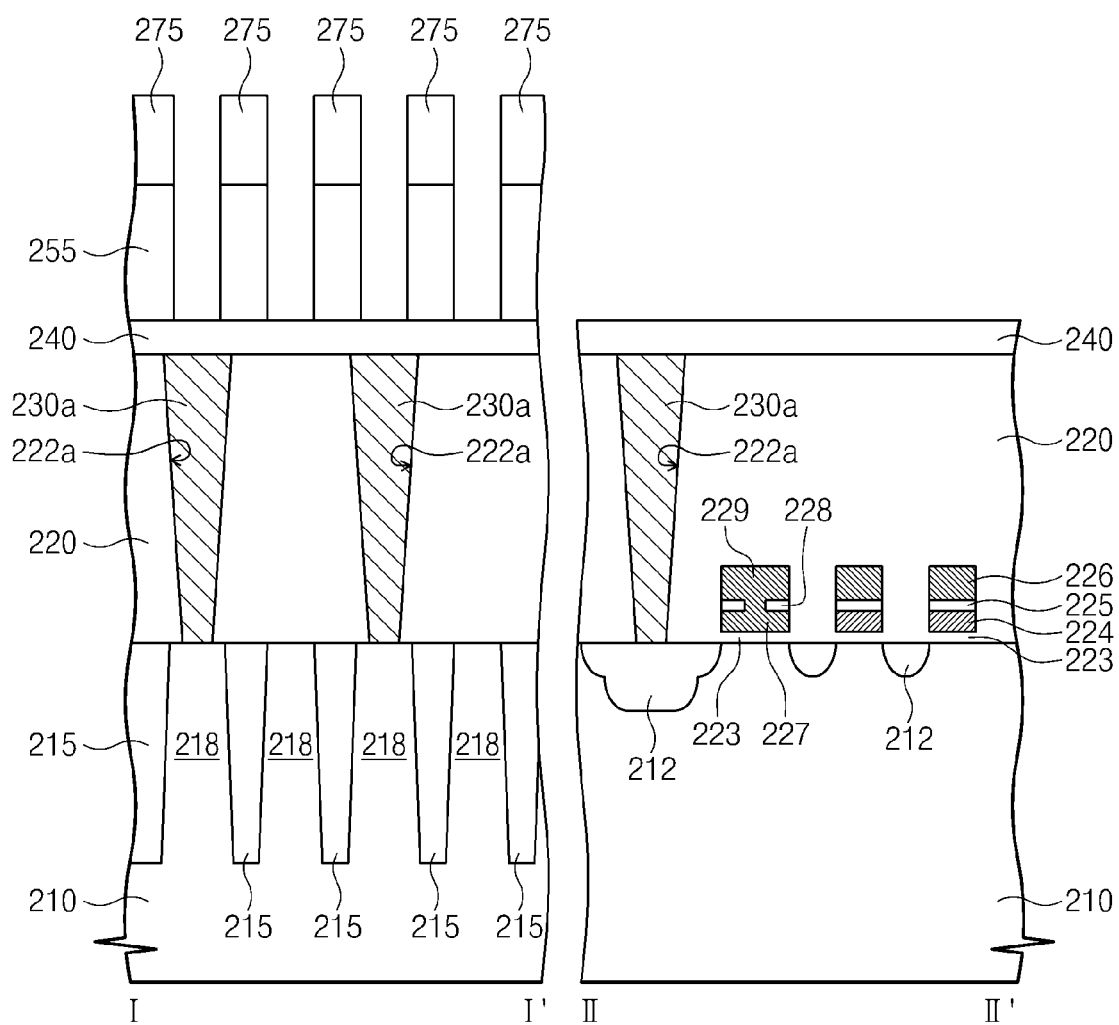

Referring to FIGS. 27 and 28, a protection layer 240 may be formed on the resultant structure. Molding patterns 255 may be formed on the protection layer 240. The molding pattern 255 may be formed using hard mask patterns 275. After a molding layer (not shown) is formed on the protection layer 240, the hard mask pattern 275 may be formed on the molding layer. The molding layer may include material having an etching selectivity with respect to the hard mask patterns 275. For example, the molding layer may include silicon oxide and the hard mask patterns 275 may include polysilicon. The molding layer is etched using the hard mask patterns 275 to form structures including the molding patterns 255 and the hard mask patterns 275 that are sequentially stacked on the protection layer 240.

The hard mask patterns 275 may be formed by a photolithography process. The hard mask patterns 275 may be formed at a minimum interval that can be obtained by a photolithography process. The hard mask patterns 275 may also be formed by a double patterning technique (DPT). At this time, the hard mask patterns 275 may be formed at an interval smaller than a minimum interval that can be obtained by a photolithography process.

Figure 29:
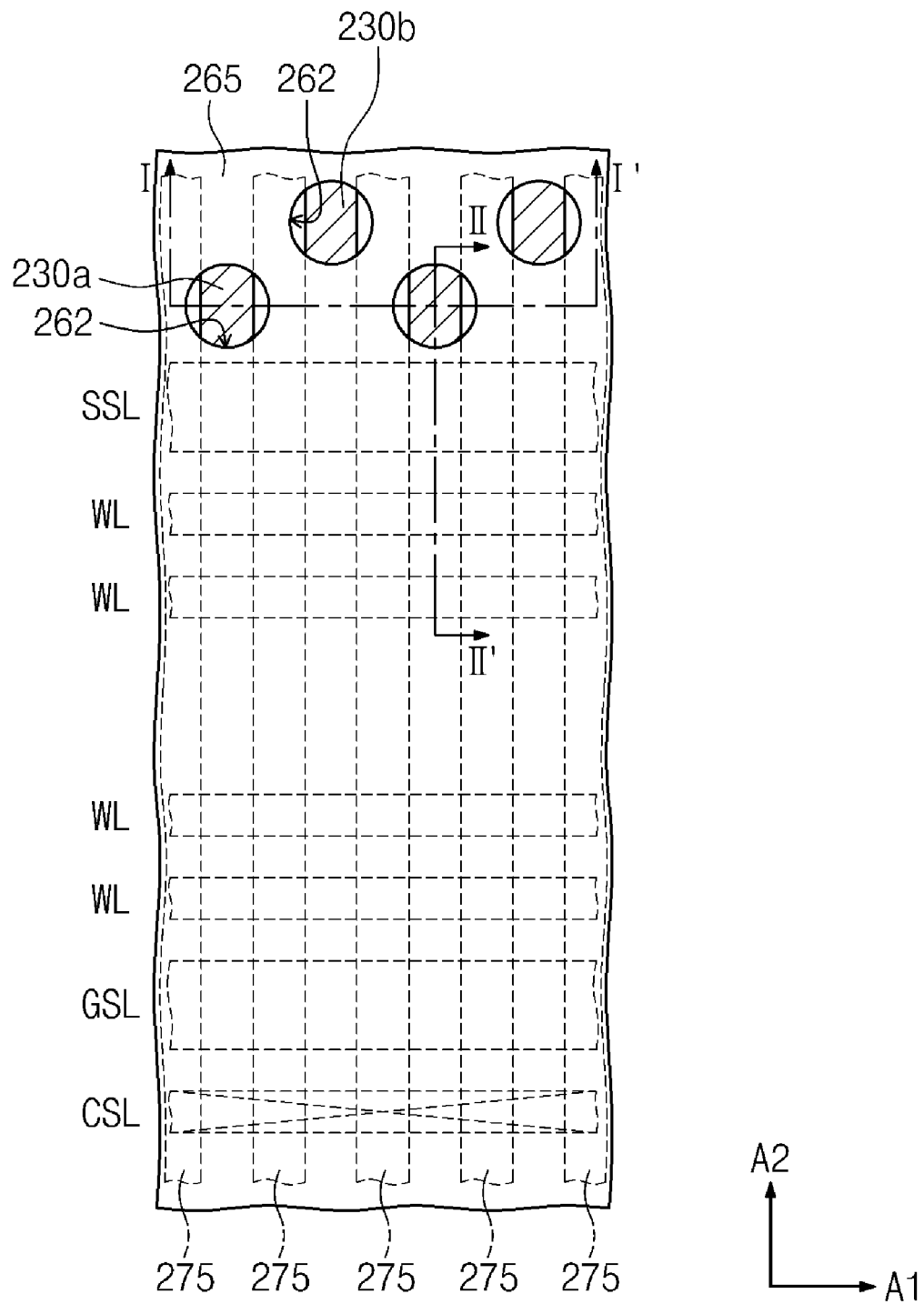
Figure 30:
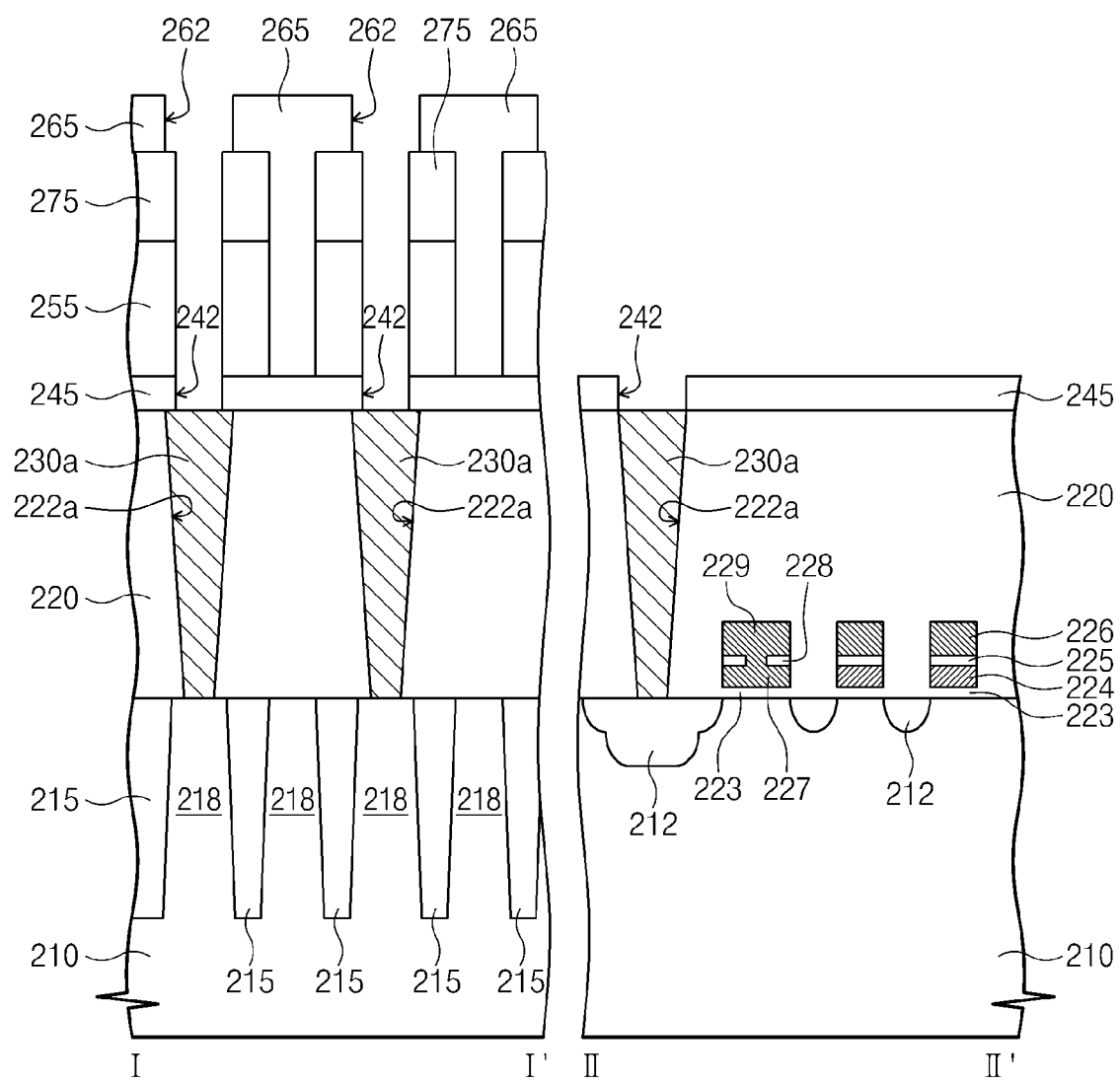

Referring to FIGS. 29 and 30, the above structures expose the protection layer 240 on the plugs 230 and may be overlapped with edges of the plugs 230. The protection layer 240 may include material having an etching selectivity with respect to the hard mask patterns 275. The protection layer 240 may include silicon nitride and the hard mask patterns 275 may include polysilicon.

A mask layer (not shown) may be formed on the structures and the protection layer 240. After a space between the structures is filled with a spin on hard mask material having a superior gap-fill characteristic, a photoresist layer may be formed. A mask pattern 265 including openings 262 may be formed by a photolithography process. The openings 262 may expose the protection layer 240 on the plugs 230 and the structures (i.e. the molding pattern 255 and the hard mask patterns sequentially stacked) overlapped with the plugs 230. The openings 262 may be formed to have the same shape, size (e.g. a width) and disposition as the plug holes 222 (or the plugs 230). The openings 262 may be formed using an exposure mask used in a formation of the plug holes 222.

The protection layer 240 exposed by the openings 262 may be selectively etched using the mask pattern 265 and the hard mask patterns 275. The protection layer 240 may include material having an etching selectivity with respect to the mask pattern 265, the hard mask patterns 275 and the plugs 230. As a result, a protection pattern 245 having protection pattern openings 242 exposing top surfaces of the plugs 230 may be formed. The protection pattern openings 242 may have the same interval as the molding patterns 255 in the first direction (A1) and may have the same width as the plugs 230 in the second direction (A2). The protection pattern openings 242 may exist only between the molding patterns 255.

Referring to FIGS. 21, 22, 29 and 30 again, the mask pattern 265 and the hard mask patterns 275 are removed to expose the molding patterns 255. Interconnections 295 may be formed by filling a space between the molding patterns 255 with conductive material. The interconnections 295 may include a connecting portion 292 filling the protection pattern openings 242. The connection portion 292 may have the same width as the interconnections 295 in the first direction (A1) and may have the same width as the plugs 230 (e.g., a top surface of the plug) in the second direction (A2). The connection portion 292 may electrically connect the plug 230 and the interconnection 295. The metal material may have a low resistance and a low ion migration in the interconnections. The metal material may include aluminum, aluminum alloy and/or copper. The interconnections 295 may be formed by a deposition process and a planarization process. A copper interconnection may be formed by a copper damascene process.

Figure 31:
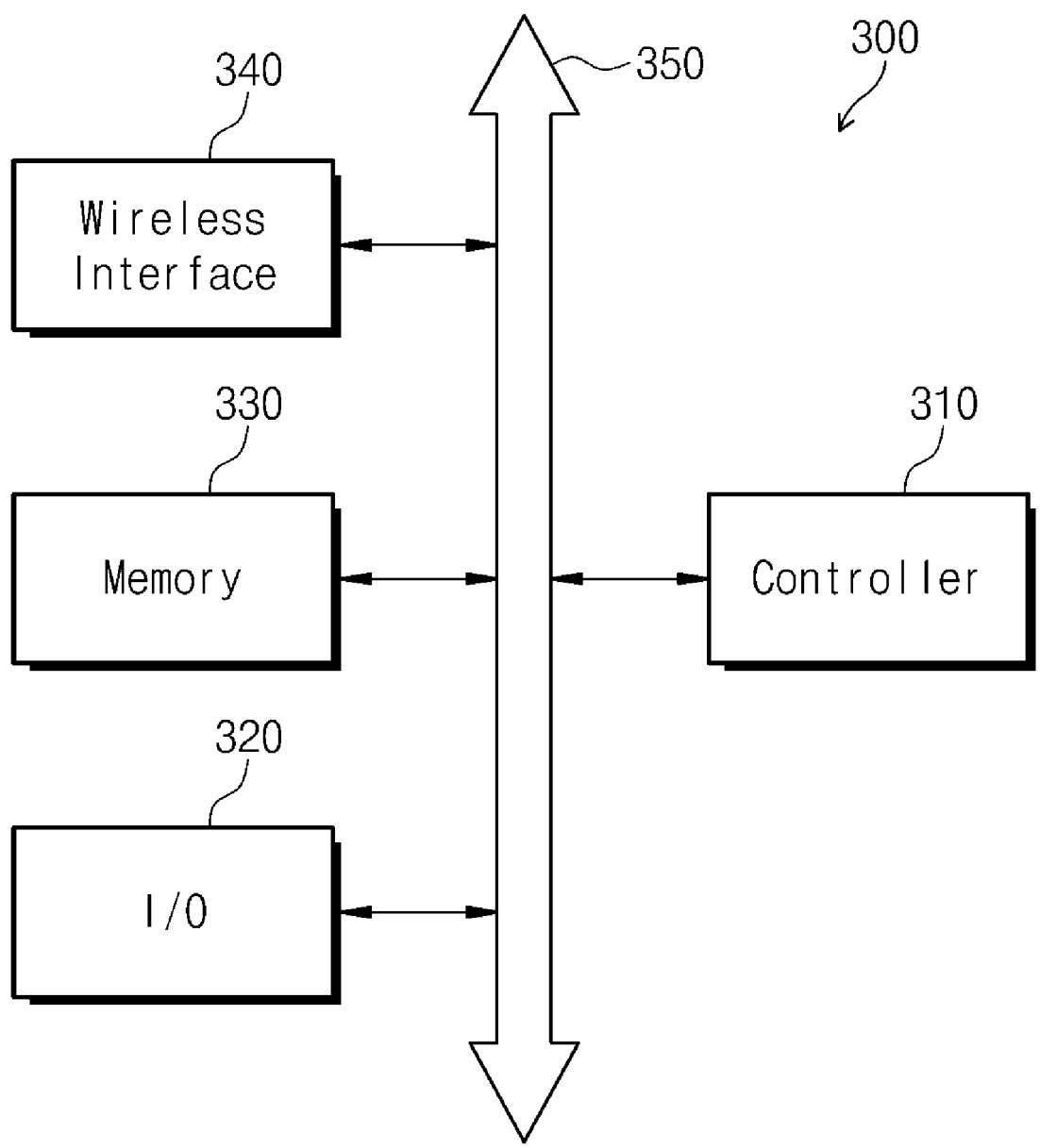
FIG. 31 is a block diagram illustrating an electronic device including a semiconductor device according to embodiments of the present invention.

Referring to FIG. 31, an electronic device 300 including a memory device according to embodiments of the present invention will be described. The electronic device 300 may be used in a wireless communication device such as a PDA, a laptop computer, a portable computer, a web tablet, a wireless phone, a cell phone and a digital music player, or a device that can transfer and/or receive information in a wireless environment.

The electronic device 300 may include a controller 310, an input/output device 320 such as a keypad, a keyboard and a display, a memory 330, a wireless interface 340 that are combined with each other through a bus 350. Controller 310 may include a microprocessor, a digital signal processor, a microcontroller, or the like. The memory 330 may be used to store an instruction executed by the controller 310. The memory 330 may also be used to store user data. The memory 330 may include a memory device according to embodiments of the present invention.

The electronic device 300 may use the wireless interface 340 so as to transfer data to a wireless communication network communicating with RF signal or receive data from the network. The wireless interface 340 may include an antenna, a wireless transceiver and so on.

The electronic device 300 according to embodiments of the present invention may be used in a communication interface protocol of a third generation communication system such as CDMA, GSM, NADC, E-TDMA, WCDMA, CDMA2000.

Figure 32:
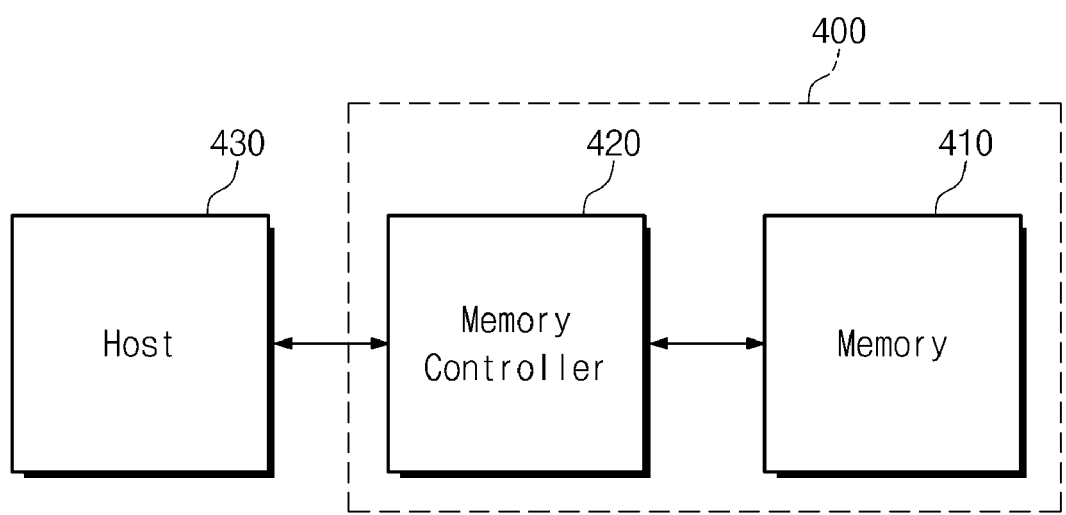
FIG. 32 is a block diagram illustrating a memory system including a semiconductor device according to embodiments of the present invention.

Referring to FIG. 32, a memory system including a memory device according to embodiments of the present invention will be described.

A memory system 400 may include a memory device 410 and a memory controller 420 to store huge amounts of data. The memory controller 420 controls the memory device 410 to read data stored in the memory device 410 or write data to the memory device 410 in response to a request of read/write of a host 430. The memory controller 420 may constitute an address mapping table to map an address provided from the host 430 (a mobile device or a computer system) into a physical address of the memory device 410.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, comprising:
   forming plugs in an interlayer insulating layer on a substrate;
   forming a protection layer on the interlayer insulating layer and the plugs;
   forming a molding layer on the protection layer;
   forming first mask patterns on the molding layer;
   forming molding patterns overlapped with edges of the plugs on the protection layer using the first mask patterns as an etch mask, the molding patterns exposing the protection layer;
   after forming the molding patterns, forming a second mask pattern on the protection layer and the molding patterns, the second mask pattern exposing at least a portion of the protection layer on the plugs;
   forming a protection pattern exposing the plugs by removing an exposed portion of the protection layer using the second mask pattern and the molding patterns as an etching mask;
   removing the first mask patterns and the second mask pattern; and
   forming interconnections between the molding patterns, the interconnections being electrically connected to the plugs.

2. The method of claim 1, wherein the molding patterns include a material having an etching selectivity with respect to the protection layer.

3. The method of claim 1, wherein the first mask patterns include a polysilicon layer and the second mask pattern includes a spin-on hard mask material layer.

4. A method of manufacturing a semiconductor device, comprising:
   forming plugs in an interlayer insulating layer on a substrate, wherein the plugs are formed in zigzags;
   after the plugs are formed in zigzags, forming a protection layer on the interlayer insulating layer and the plugs;
   forming molding patterns overlapped with edges of the plugs on the protection layer;
   forming a mask pattern on the protection layer and the molding patterns, the mask pattern exposing at least a portion of the protection layer on the plugs;
   forming a protection pattern exposing the plugs by removing an exposed portion of the protection layer using the mask pattern and the molding patterns as an etching mask;
   removing the mask pattern; and
   forming interconnections between the molding patterns, the interconnections being electrically connected to the plugs.

5. The method of claim 4, further comprising stacking hard mask patterns on the molding patterns.

6. The method of claim 5, wherein the protection layer includes a material having an etching selectivity with respect to the mask pattern and the hard mask patterns.

7. The method of claim 5, wherein forming the molding patterns and-the hard mask patterns comprises:
   forming a molding layer on the protection layer;
   forming a polysilicon layer on the molding layer;
   forming a photoresist pattern on the polysilicon layer;
   continuously etching the polysilicon layer and the molding layer using the photoresist pattern; and
   removing the photoresist pattern.

8. The method of claim 7, after removing the mask pattern, further comprising removing the polysilicon layer.

9. The method of claim 5, wherein forming the molding patterns and the hard mask patterns is performed by a double patterning technique.

10. The method of claim 5, wherein the mask pattern includes openings having a same width and arrangement as the plugs.

11. The method of claim 10, wherein forming the mask pattern comprises:
    forming a spin-on hard mask layer on the protection layer and the hard mask pattern so as to fill a space between the molding patterns;
    forming a photoresist layer on the spin-on hard mask layer;
    selectively exposing the photoresist layer;
    selectively removing the photoresist layer on the plugs; and
    removing the spin on hard mask layer exposed by a removal of the photoresist layer.

12. The method of claim 5, wherein the protection layer includes silicon nitride, the molding patterns include silicon oxide, the hard mask patterns include polysilicon and the mask pattern includes photoresist.

13. The method of claim 4, wherein forming the plugs comprises:

forming first plug holes and second plug holes which are exposing the substrate by selectively etching the interlayer insulating layer; and filling the first plug holes and the second plug holes with conductive material, wherein the first plug holes and the second plug holes are disposed along a first direction, and each of the second plug holes is disposed between adjacent first plug holes and is spaced apart from first plug holes toward a second direction crossing the first direction.

14. The method of claim 4, further comprising forming a string selection line which is adjacent to the plugs on the substrate and extends in the first direction, word lines adjacent to the string selection line and a ground selection line adjacent to the word lines.

* * * * *